US010818496B2

(12) United States Patent
Arai et al.

(10) Patent No.: US 10,818,496 B2
(45) Date of Patent: Oct. 27, 2020

(54) SEMICONDUCTOR DEVICE HAVING CRYSTAL DEFECTS AND METHOD OF MANUFACTURING THE SEMICONDUCTOR DEVICE HAVING CRYSTAL DEFECTS

(71) Applicant: SHINDENGEN ELECTRIC MANUFACTURING CO., LTD., Tokyo (JP)

(72) Inventors: Daisuke Arai, Saitama (JP); Mizue Kitada, Saitama (JP); Takeshi Asada, Saitama (JP); Noriaki Suzuki, Saitama (JP); Koichi Murakami, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/522,652

(22) Filed: Jul. 26, 2019

(65) Prior Publication Data

US 2020/0020536 A1      Jan. 16, 2020

Related U.S. Application Data

(63) Continuation-in-part of application No. PCT/JP2018/009591, filed on Mar. 12, 2018.

(30) Foreign Application Priority Data

Nov. 1, 2017      (WO) .................. PCT/JP2017/039640

(51) Int. Cl.
*H01L 21/22*   (2006.01)
*H01L 21/324*   (2006.01)
(Continued)

(52) U.S. Cl.
CPC .......... *H01L 21/221* (2013.01); *H01L 21/324* (2013.01); *H01L 29/0634* (2013.01);
(Continued)

(58) Field of Classification Search
CPC combination set(s) only.
See application file for complete search history.

(56) References Cited

U.S. PATENT DOCUMENTS

2011/0147829 A1    6/2011   Nakajima
2014/0242769 A1*   8/2014   Yamada ................ H01L 21/324
                                             438/289
(Continued)

FOREIGN PATENT DOCUMENTS

JP          2015-18913 A      1/2015
JP          2015-135987 A     7/2015
(Continued)

OTHER PUBLICATIONS

International Search Report in PCT/JP2018/009591, dated May 22, 2018, 3pp.
(Continued)

*Primary Examiner* — Nduka E Ojeh
(74) *Attorney, Agent, or Firm* — Hauptman Ham, LLP

(57) ABSTRACT

A MOSFET includes: a semiconductor base substrate having n-type column regions and p-type column regions, the n-type column regions and the p-type column regions forming a super junction structure; and a gate electrode which is formed on a first main surface side of the semiconductor base substrate by way of a gate insulation film, wherein crystal defects whose density is increased locally as viewed along a depth direction are formed in the n-type column regions and the p-type column regions, using the first main surface as a reference and assuming a depth to a deepest portion of the super junction structure as Dp, a depth at which density of the crystal defects exhibits a maximum value as Dd, and a half value width of density distribution of the crystal defects as W, a relationship of
(Continued)

$0.25D_p \leq D_d < 0.95D_p$ and a relationship of $0.05D_p < W < 0.5D_p$ are satisfied.

17 Claims, 11 Drawing Sheets

(51) Int. Cl.
*H01L 29/06* (2006.01)
*H01L 29/10* (2006.01)
*H01L 29/32* (2006.01)
*H01L 29/66* (2006.01)
*H01L 29/78* (2006.01)

(52) U.S. Cl.
CPC .......... *H01L 29/1095* (2013.01); *H01L 29/32* (2013.01); *H01L 29/66734* (2013.01); *H01L 29/7805* (2013.01); *H01L 29/7813* (2013.01)

(56) References Cited

U.S. PATENT DOCUMENTS

2015/0014764 A1 1/2015 Tamura et al.
2017/0288021 A1 10/2017 Kubo

FOREIGN PATENT DOCUMENTS

JP 2017-183419 A 10/2017
WO 2010/024433 A1 3/2010

OTHER PUBLICATIONS

International Search Report in PCT/JP2017/039640, dated Dec. 26, 2017, 3pp.

* cited by examiner

DENSITY OF CRYSTAL DEFECTS

DENSITY OF CRYSTAL DEFECTS

SEMICONDUCTOR DEVICE HAVING CRYSTAL DEFECTS AND METHOD OF MANUFACTURING THE SEMICONDUCTOR DEVICE HAVING CRYSTAL DEFECTS

RELATED APPLICATIONS

The present application is a Continuation-in-part application of PCT international application No. PCT/JP2018/009591 filed on Mar. 12, 2018, which claims priority from International Application No. PCT/JP2017/039640 filed Nov. 1, 2017, the disclosures of which are hereby incorporated by reference herein in their entirety.

BACKGROUND OF THE INVENTION

1. Field of the Invention

The present invention relates to a semiconductor device and a method of manufacturing a semiconductor device.

2. Description of the Related Art

Conventionally, with respect to a MOSFET which uses a super junction structure, there has been known a MOSFET where crystal defects are formed by He irradiation (see JR 2015-135987 A, for example)

As shown in FIG. 17, the conventional MOSFET 900 includes a semiconductor base substrate 910 which has n-type column regions 913 and p-type column regions 915 and in which a super junction structure is formed of the n-type column regions 913 and the p-type column regions 915; and gate electrodes 922 which are formed on a first main surface side of the semiconductor base substrate 910 by way of gate insulation films 920.

The MOSFET 900 includes, besides the above-mentioned constitutional elements, a low-resistance semiconductor layer (drain layer) 912, a buffer layer 914, a base region 916, source regions 924, an interlayer insulation film 926, metal plugs 930, a source electrode 934, and a drain electrode 936.

In the conventional MOSFET 900, density of crystal defects exhibits a max mum value at a depth between a deepest portion of the super junction structure (the n-type column regions 913 and the p-type column regions 915) and the low-resistance semiconductor layer 912 (the MOSFET 900, a depth at which the buffer layer 914 exists) (see marks × in FIG. 17).

According to the conventional MOSFET 900, carriers can be recoupled at the crystal defects (a lifetime of carriers can be controlled) at the time of reverse recovery of a body diode. As a result, the carriers can be recovered even when the carriers do not move to an electrode. Accordingly, in the conventional MOSFET, a switching speed can be increased by shortening a reverse recovery time (Trr). As a result, a reverse recovery charge amount (Qrr) can be reduced thus providing a MOSFET which can reduce a recovery loss.

SUMMARY OF THE INVENTION

In general, in a MOSFET having a super junction structure, a junction capacitance of the super junction structure is large so that a depletion layer rapidly expands from a pn junction at the time of a reverse recovery of a body diode and hence, a tendency is observed where a reverse recovery current (Irr) rapidly becomes small (dIr/dt being increased) after the reverse recovery current (Irr) passes a peak value (Irp) (a tendency where the reverse recovery current (Irr) becoming a hard recovery state).

Further, as in the case of the conventional MOSFET 900, in a MOSFET where density of crystal defects exhibits a maximum value in depth between a deepest portion of the super junction structure (the n-type column region and the p-type column region) and a low-resistance semiconductor layer, because of excessive shortening of a lifetime of carriers, a reverse recovery current (Irr) becomes further rapidly small after the reverse recovery current (Irr) passes a peak value (Irp).

When the reverse recovery current (Irr) becomes rapidly small after the reverse recovery current (Irr) passes a peak value (Irp), an induced electromotive force (V=Ls×dIr/dt) generated by a parasitic inductance component (Ls) is increased so that oscillation is liable to be generated. That is, a MOSFET having a super junction structure has a drawback that oscillation is liable to be generated, and a MOSFET where crystal defects are formed as in the case of the conventional MOSFET 900 has a drawback that oscillation is more liable to be generated.

It is considered that substantially the same tendency as the case described above occurs also in a semiconductor device having a super junction structure other than a MOSFET (for example, a diode).

The present invention has been made so as to overcome the above-mentioned drawbacks, and it is an object of the present invention to provide a semiconductor device where a recovery loss can be reduced, and oscillation is not easily generated compared to conventional semiconductor devices (semiconductor devices where density of crystal defects exhibits a maximum value in depth between a deepest portion of a super junction structure and a low-resistance semiconductor layer, the same definition being applicable to the description made hereinafter).

It is another object of the present invention to provide a method of manufacturing a semiconductor device for manufacturing a semiconductor device which can reduce a recovery loss and in which oscillation is not easily generated compared to conventional semiconductor devices.

According to an aspect of the present invention, there is provided a semiconductor device which includes: a semiconductor base substrate having an n-type column region and a p-type column region, the n-type column region and the p-type column region forming a super junction structure; and a gate electrode formed on a first main surface side of the semiconductor base substrate by way of a gate insulation film, wherein crystal defects whose density is increased locally as viewed along a depth direction are formed in the n-type column region and the p-type column region, and using the first main surface as a reference and assuming a depth to a deepest portion of the super junction structure as Dp, a depth at which density of the crystal defects exhibits a maximum value as Dd, and a half value width of density distribution of the crystal defects as W, a relationship of $0.25Dp \leq Dd < 0.95Dp$ and a relationship of $0.05Dp < W < 0.5Dp$ are satisfied.

In the semiconductor device according to the present invention, it is preferable that a relationship of $0.4Dp \leq Dd < 0.9Dp$ be satisfied.

In the semiconductor device according to the present invention, it is preferable that a relationship of $(Dp-Dd) > 0.5W$ be satisfied.

According to an aspect of the present invention, there is provided a method of manufacturing a semiconductor device which includes in a following order: a preparation step where a predetermined structural body is prepared, the predetermined structural body including: a semiconductor base substrate having an n-type column region and a p-type column region, the n-type column region and the p-type column region forming a super junction structure; and a gate electrode formed on a first main surface side of the semiconductor base substrate by way of a gate insulation film; and a crystal defect forming step where crystal defects are formed in the n-type column region and the p-type column region of the predetermined structural body such that density of the crystal defects is increased locally as viewed along a depth direction, wherein in the crystal defect forming step, the crystal defects are formed such that, using the first main surface as a reference and assuming a depth to a deepest portion of the super junction structure as Dp, a depth of the depth position at which density of the crystal defects exhibits a maximum value as Dd, and a half value width of density distribution of the crystal defects as W, a relationship of 0.25Dp≤Dd<0.95Dp and a relationship of 0.05Dp<W<0.5Dp are satisfied.

In the method of manufacturing a semiconductor device according to the present invention, it is preferable that, in the crystal defect forming step, the crystal defects be formed such that a relationship of 0.4Dp≤Dd<0.9Dp is satisfied.

In the method of manufacturing a semiconductor device according to the present invention, it is preferable that, in the crystal defect forming step, the crystal defects be formed such that a relationship of (Dp−Dd)>0.5W is satisfied.

In the method of manufacturing a semiconductor device according to the present invention, it is preferable that, in the crystal defect forming step, the crystal defects be formed by He irradiation or by proton irradiation.

In the method of manufacturing a semiconductor device according to the present invention, it is preferable that a dose amount of the He irradiation or the proton irradiation fall within a range of $5 \times 10^{10}/cm^2$ to $2 \times 10^{12}/cm^2$.

In the method of manufacturing a semiconductor device according to the present invention, it is preferable that the method further include an annealing step where annealing is performed at a temperature of 300° C. to 500° C. after the crystal defect forming step.

In the semiconductor device according to the present invention, it is preferable that assuming a semiconductor device having substantially the same configuration as the semiconductor device excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, a relationship of |Dc−Dd|≥0.5W be satisfied.

In the method of manufacturing a semiconductor device of the present invention, it is preferable that assuming a semiconductor device having substantially the same configuration as a semiconductor device which is intended to be manufactured excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, in the crystal defect forming step, the crystal defects be formed such that a relationship of |Dc−Dd|≥0.5W is satisfied.

According to another aspect of the present invention, there is provided a method of manufacturing a semiconductor device which includes includes: a preparation step where a predetermined structural body is prepared, the predetermined structural body including a semiconductor base substrate having an n-type column region and a p-type column region, the n-type column region and the p-type column region forming a super junction structure; and a gate electrode formed on a first main surface side of the semiconductor base substrate by way of a gate insulation film; and a crystal defect forming step where crystal defects are formed in the n-type column region and the p-type column region of the predetermined structural body such that density of the crystal defects is increased locally as viewed along a depth direction, wherein in the crystal defect forming step, the crystal defects are formed such that, using the first main surface as a reference and assuming a depth to a deepest portion of the super junction structure as Dp, a depth at which density of the crystal defects exhibits a maximum value as Dd, and a half value width of density distribution of the crystal defects as W, a relationship of 0.25Dp≤Dd<0.95Dp and a relationship of 0.05Dp<W<0.5Dp are satisfied.

In the semiconductor device according to the present invention, it is preferable that assuming a semiconductor device having substantially the same configuration as the semiconductor device excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, a distribution of density of the crystal defects as viewed along a depth direction is a Gaussian distribution, and a relationship of Dd≤Dc−2σ be satisfied.

In the semiconductor device according to the present invention, it is preferable that the distribution of density of the crystal defects as viewed along the depth direction be a Gaussian distribution, and a relationship of Dd≤Dp−2σ be satisfied.

In the semiconductor device according to the present invention, it is preferable that a relationship of Dd≤0.5Dp be satisfied.

In the method of manufacturing a semiconductor device according to the present invention, it is preferable that assuming a semiconductor device having substantially the same configuration as the semiconductor device excluding that the crystal defects are not formed as a base semiconductor device, and assuming a center depth of a region where a carrier pool is formed when a reverse recovery current exhibits a peak value in a case where a reverse recovery operation is to the base semiconductor device from a state that a body diode of the base semiconductor device is biased forward so that a forward current which is ½ or more of a rated current flows as Dc, in the crystal defect forming step, the crystal defects be formed such that the distribution of density of the crystal defects as viewed along the depth direction is a Gaussian distribution, and a relationship of Dd≤Dc−2σ is satisfied.

In the method of manufacturing a semiconductor device according to the present invention, it is preferable that, in the crystal defect forming step, the crystal defects be formed such that the distribution of density of the crystal defects as viewed along the depth direction is a Gaussian distribution, and a relationship of Dd≤Dp−2σ is satisfied.

In the method of manufacturing a semiconductor device according to the present invention, it is preferable that, in the crystal defect forming step, the crystal defects be formed such that a relationship of Dd≤0.5Dp is satisfied.

Advantageous Effects of the Invention

According to the semiconductor device of the present invention, the crystal defects whose density is increased locally as viewed along a depth direction are formed in the n-type column region and the p-type column region. With such a configuration, in the same manner as the conventional semiconductor devices, carriers can be recoupled at the crystal defects (a lifetime of carriers can be controlled) at the time of reverse recovery of a body diode. As a result, the carriers can be recovered even when the carriers do not move to an electrode. Accordingly, in the semiconductor device of the present invention, a switching speed can be increased by shortening a reverse recovery time (Trr). As a result, a reverse recovery charge amount (Qrr) can be reduced thus providing a semiconductor device which can reduce a recovery loss.

According to the semiconductor device of the present invention, the relationship of 0.25Dp≤Dd<0.95Dp and the relationship of 0.05Dp<W<0.5Dp (particularly, 0.25Dp≤Dd<0.95Dp) are satisfied. Accordingly, compared to the conventional semiconductor devices, a time until carriers existing in the vicinity of the deepest portion of the super junction structure are recoupled becomes relatively long and hence, it is possible to suppress a rapid growth of a depletion layer from a pn junction at the time of reverse recovery of the body diode. As a result, according to the semiconductor device of the present invention, it is possible to suppress the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component. As a result, the semiconductor device according to the present invention becomes a semiconductor device where oscillation is not easily generated compared to conventional semiconductor devices.

Accordingly, the semiconductor device of the present invention becomes a semiconductor device which can reduce a recovery loss and in which oscillation is not easily generated compared to conventional semiconductor devices.

According to the method of manufacturing a semiconductor device according to the present invention, in the crystal defect forming step, the crystal defects are formed such that, using the first main surface as a reference, a relationship of 0.25Dp≤Dd<0.95Dp and a relationship of 0.05Dp<W<0.5Dp are satisfied. Accordingly, it is possible to manufacture a semiconductor device which can reduce a recovery loss and in which oscillation is not easily generated compared to conventional semiconductor devices as described previously.

The present invention is applicable to various semiconductor devices which use a super junction structure. However, the present invention is most suitably applicable to a MOSFET.

BRIEF DESCRIPTION OF DRAWINGS

FIG. 1A is a cross-sectional view showing a portion of the MOSFET 100 (a portion of a part referred to as an active element part or an active region, a portion of the MOSFET being defined in the same manner hereinafter). FIG. 1B is a graph showing the distribution of crystal defects in the MOSFET 100. FIG. 1A is the cross-sectional view showing a portion of the MOSFET 100 and hence, both left and right ends of the MOSFET 100 in FIG. 1A do not indicate terminal ends of the MOSFET 100 (the same understanding being applicable to FIG. 3, FIG. 5A, FIG. 5B, FIG. 6A, FIG. 6B, FIG. 7A, FIG. 8A, FIG. 9A, FIG. 10A, FIG. 11A, FIG. 12A, FIG. 13A, FIG. 14A, FIG. 15, FIG. 16, and FIG. 17). An axis of ordinates of a graph shown in FIG. 1B indicates a depth using a first main surface as a reference, and an axis of abscissas of the graph indicates density of crystal defects. In FIG. 1A, a broken line which connects marks × (marks schematically showing a position where density of crystal defects is high) is an auxiliary line for visually facilitating understanding of a depth Dp at which density of crystal defects exhibits a maximum value, and is not drawn for indicating a structure (the same understanding being applicable to cross-sectional views showing portions of other MOSFETs described later). The graph in FIG. 1B schematically indicates the density distribution of crystal defects, and neither the axis of ordinates nor the axis of abscissas of the graph are intended to be used to indicate specific numerical values. However, FIG. 1A and FIG. 1B correspond to each other in a depth direction of the semiconductor base substrate 110 (the same understanding being applicable to FIG. 7A, FIG. 8A, FIG. 9A, FIG. 10A, FIG. 11A, FIG. 13A, and FIG. 14A described later);

FIG. 3 is provided for describing a positional relationship between the depth Dd at which density of crystal defects exhibits a maximum value and a region C where a carrier pool is liable to be formed. Accordingly, FIG. 3 does not indicate that two depths at which density of crystal defects exhibits a maximum value exist in the MOSFET 200. The depth Dd1 at which density of crystal defects exhibits a maximum value corresponds to the MOSFET 100 according to the embodiment 1, and the depth Dd2 at which density of crystal defects exhibits a maximum value corresponds to the conventional MOSFET 900;

FIG. 4A to FIG. 4E show the formation of the carrier pool which changes in this order along with a lapse of time. FIG. 4A to FIG. 4E are views obtained based on a result of a simulation performed under conditions considered proper. Accordingly, although FIG. 4A to FIG. 4E are not directly applicable to all MOSFETs, MOSFETs which use a super junction structure exhibit substantially the same tendency as the MOSFET shown in FIG. 4A to FIG. 4E. Regions shown in FIG. 4A to FIG. 4E are regions which correspond to a region indicated by symbol A in FIG. 3. However, FIG. 3 is a schematic view (a view where sizes and a ratio of the described structure are not accurate since priority is assigned to facilitating understanding of the invention) and hence, the structure shown in FIG. 3 and the structure shown in FIG. 4A to FIG. 4E do not strictly agree with each other. In the simulation shown in FIG. 4A to FIG. 4E, a metal plug which is not an indispensable element in the present invention is not taken into consideration;

FIG. 5A and FIG. 5B are step views respectively;

FIG. 6A and FIG. 6B are step views respectively;

FIG. 7A is a cross-sectional view showing the configuration of a portion of the MOSFET 101, and FIG. 7B is a graph showing the distribution of crystal defects in the MOSFET 101. An axis of ordinates of the graph shown in FIG. 7B indicates a depth using a first main surface as a reference, and an axis of abscissas of the graph indicates density of crystal defects;

FIG. 8A is a cross-sectional view showing the configuration of a portion of the MOSFET 102, and FIG. 8B is a graph showing the distribution of crystal defects in the MOSFET 102. An axis of ordinates of the graph shown in FIG. 8B indicates a depth using a first main surface as a reference, and an axis of abscissas of the graph indicates density of crystal defects;

FIG. 9A is a cross-sectional view showing the configuration of a portion of the MOSFET 103, and FIG. 9B is a graph showing the distribution of crystal defects in the MOSFET 103. An axis of ordinates of the graph shown in FIG. 9B indicates a depth using a first main surface as a reference, and an axis of abscissas of the graph indicates density of crystal defects;

FIG. 10A is a cross-sectional view showing the configuration of a portion of the MOSFET 104, and FIG. 10B is a graph showing the distribution of crystal defects in the MOSFET 104. An axis of ordinates of the graph shown in FIG. 10B indicates a depth using a first main surface as a reference, and an axis of abscissas of the graph indicates density of crystal defects;

FIG. 11A is a cross-sectional view showing the configuration of a portion of the MOSFET 400, and FIG. 11B is a graph showing the distribution of crystal defects in the MOSFET 400. An axis of ordinates of the graph shown in FIG. 11B indicates a depth using a first main surface as a reference, and an axis of abscissas of the graph indicates density of crystal defects. A chain line in FIG. 11A is an auxiliary line for visually facilitating understanding of a center depth Dc of a region where a carrier pool is formed when a reverse recovery current exhibits a peak value (described later), and is not drawn for indicating a structure of a semiconductor base substrate 110. Chain lines shown in FIG. 12A, FIG. 13A, and FIG. 14A described later are substantially equal to the above-mentioned chain line;

FIG. 12A is a cross-sectional view showing the configuration of a portion of the base semiconductor device 400a, and FIG. 12B is a view corresponding to FIG. 4E, and is a view for describing a center depth Dc by taking a state shown in the above-mentioned FIG. 4E as an example. In FIG. 12A and FIG. 12B, symbol Rc indicates a region where a carrier pool is formed when a reverse recovery current exhibits a peak value in the case where a reverse recovery operation of the base semiconductor device 400a is performed from a state where a forward bias is applied to body diode of the base semiconductor device 400a so that a forward current which is ½ or more of a rated current flows;

FIG. 13A is a cross-sectional view showing the configuration of a portion of the MOSFET 500, and FIG. 13B is a graph showing the distribution of crystal defects in the MOSFET 500. An axis of ordinates of the graph shown in FIG. 13B indicates a depth using a first main surface as a reference, and an axis of abscissas of the graph indicates density of crystal defects. A double-dashed chain line in FIG. 13A is an auxiliary line for facilitating understanding of a depth corresponding to Dc−2σ visually, and is not drawn for indicating a structure of a semiconductor base substrate 110. The distribution of crystal defects in the MOSFET 500 according to the embodiment 7 is substantially equal to the distribution of crystal defects in the MOSFET 100 according to the embodiment 1. In FIG. 13B, the illustration of symbols and arrows made in FIG. 15 is omitted;

FIG. 14A is a cross-sectional view showing the configuration of a portion of the MOSFET 502, and FIG. 14B is a graph showing the distribution of crystal defects in the MOSFET 502. An axis of ordinates of the graph shown in FIG. 14B indicates a depth using a first main surface as a reference, and an axis of abscissas of the graph indicates density of crystal defects. A double-dashed chain line in FIG. 14A is an auxiliary line for facilitating understanding of a depth corresponding to Dp−2σ visually, and is not drawn for indicating a structure of a semiconductor base substrate 110. The distribution of crystal defects in the MOSFET 502 according to the embodiment 8 is substantially equal to the distribution of crystal defects in the MOSFET 100 according to the embodiment 1. In FIG. 14B, the illustration of symbols and arrows made in FIG. 1B is omitted.

DESCRIPTION OF PREFERRED EMBODIMENTS

Figure 1A:
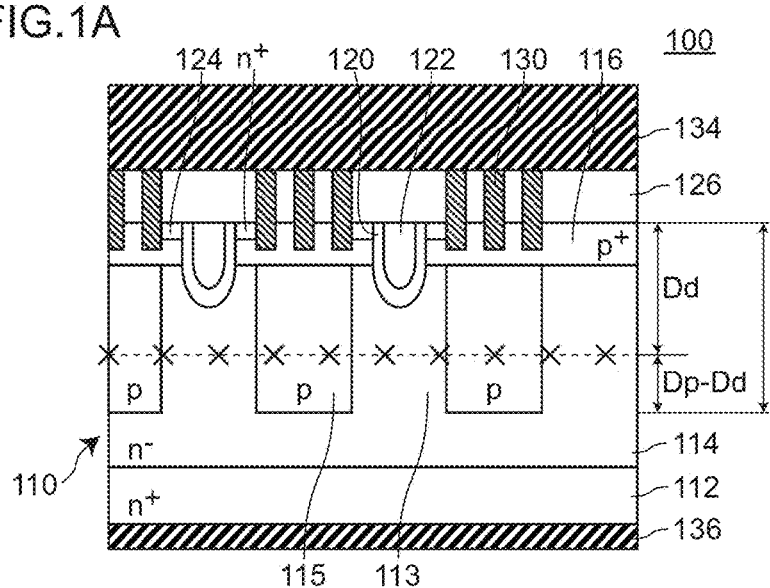
FIG. 1A and FIG. 1B are views for describing a MOSFET 100 according to an embodiment 1.

Hereinafter, a semiconductor device and a method of manufacturing a semiconductor device according to the present invention are described in accordance with embodiments shown in the drawings. The respective drawings are schematic drawings, and do not always strictly reflect actual structures and actual configurations. The respective embodiments described hereinafter are not intended to limit the invention relating to Claims. Further, it is not always a case that all of various elements described in the respective embodiments and combinations of these elements are indispensable as means for solving problems of the present invention. In the respective embodiments, constitutional elements basically having the same configurations and technical features (including constitutional elements which are not completely identical with respect to shapes or the like) are indicated by using the same symbols, and the description of these constitutional elements may be omitted.

Embodiment 1

1. Configuration of Semiconductor Device (MOSFET 100)

Firstly, the semiconductor device according to the embodiment 1 is described.

The semiconductor device according to the embodiment 1 is an MOSFET, and the MOSFET is described hereinafter as a MOSFET 100.

As shown in FIG. 1A, the MOSFET 100 according to the embodiment 1 is a MOSFET which includes: a semiconductor base substrate 110 which has n-type column regions 113 and p-type column regions 115 and in which a super junction structure is formed of the n-type column regions 113 and the p-type column regions 115; and gate electrodes 122 which are formed on a first main surface side of the semiconductor base substrate 110 by way of gate insulation films 120. A drain-source withstand voltage of the MOSFET 100 is 300 V or more and is 600 V, for example.

In this specification, "super junction structure" means a structure where n-type column regions and p-type column regions are arranged alternately in a repeated manner as viewed on a predetermined cross section.

The MOSFET 100 includes, besides the above-mentioned constitutional elements, source regions 124, an interlayer insulation film 126, metal plugs 130, a source electrode 134, and a drain electrode 136. The semiconductor base substrate 110 of the MOSFET 100 further includes, besides the n-type column regions 113 and the p-type column regions 115, a low-resistance semiconductor layer 112, a buffer layer 114, and a base region 116. The first main surface is a surface of the semiconductor base substrate 110 (a portion formed of a semiconductor). In the MOSFET 100, a boundary surface between the base region 116 and the interlayer insulation film 126 forms the first main surface. All of the above-mentioned constitutional elements of the MOSFET 100 are known elements and hence, only the basic matters are described in the description made hereinafter.

The low-resistance semiconductor layer 112 in the MOSFET 100 is of an $n^+$-type. A thickness of the low-resistance semiconductor layer 112 fails within a range of 100 to 400 μm inclusive, for example. Dopant concentration of the low-resistance semiconductor layer 112 falls within a range of $1\times10^{19}$ cm$^{-3}$ to $1\times10^{20}$ cm$^3$, for example.

In the MOSFET 100, the n-type column regions 113 and the p-type column regions 115 have substantially the same cross-sectional shape respectively, and are arranged at an equal interval. So long as advantageous effects brought about by the super junction structure can be obtained, the n-type column regions and the p-type column regions may not have substantially the same cross-sectional shape, and may not be arranged at an equal interval.

Dopant concentration in the n-type column regions 113 and dopant concentration in the p-type column regions 115 fall within a range of $5\times10^{13}$ cm$^{-3}$ to $1\times10^{16}$ cm$^3$, for example. So long as advantageous effects brought about by the super junction structure can be obtained, a total amount of dopant in the n-type column regions 113 and a total amount of dopant in the p-type column regions 115 may be set equal to each other or may be set different from each other.

In the MOSFET 100, the n-type column regions 113 and the buffer layer 114 are integrally formed thus forming an n-type semiconductor layer. A thickness of the n-type semiconductor layer falls within a range of 5 μm to 120 μm, for example.

The base region 116 is of a $p^+$-type, and is formed on surfaces of the n-type column regions 113 and surfaces of the p-type column regions 115.

Using the first main surface as a reference, a depth position of a deepest portion of the base region 116 falls within a range of 0.5 μm to 4.0 μm, for example. Dopant concentration of the base region 116 falls within a range of $5\times10^{16}$ cm$^{-3}$ to $10\times10^{18}$ cm$^{-3}$, for example.

A trench (not indicated by a symbol in the drawings) is formed in the base region 116 in a penetrating manner to a depth position which reaches the n-type column region 113, and the gate electrode 122 is formed on an inner peripheral surface of the trench in an embedded manner by way of the gate insulation film 120.

A depth of the trench is 3 μm, for example.

The gate insulation film 20 formed of a silicon dioxide film formed by a thermal oxidation method, for example. A thickness of the gate insulation film 120 is 100 nm, for example.

The gate electrode 122 is made of low-resistance polysilicon formed by a CVD method or an ion implantation method.

Source regions 124 are of an $n^+$-type. The source regions 124 are disposed on a surface of the base region 116, and are formed such that a part of the source region 124 is exposed on the inner peripheral surface of the trench. Using a first main surface as a reference, a depth position of a deepest portion of the source region 124 can be set to a value which falls within a range of 0.1 μn to 0.4 μm, for example. Dopant concentration in the source region 124 can be set to fall within a range of $5\times10^{19}$ cm$^{-3}$ to $2\times10^{20}$ cm$^{-3}$, for example.

The interlayer insulation film 126 is formed so as to cover the base region 116, the gate insulation films 120, the gate electrodes 122, and the source regions 124. The interlayer insulation film 126 is formed of a PSG film formed by a CVD method and having a thickness of 1000 nm, for example.

The metal plugs 130 are formed by filling predetermined metal in contact holes (not indicated by a symbol in the drawings) which penetrate the interlayer insulation film 126 and reach the base region 116. A p$^{++}$-type diffusion region having higher dopant concentration than the base region 116 may be formed on a bottom surface of the metal plug 130.

A stripe width of the contact hole or the metal plug is 0.5 µm, for example. A barrier metal (not shown in the drawings) is formed on an inner surface of the contact hole. The metal plug 130 is formed by filling tungsten, for example, in the contact hole by way of the barrier metal.

The source electrode 134 is formed on (a surface) of the interlayer insulation film 126, and is electrically connected with the base region 116 and the source regions 124 via the metal plugs 130. The source electrode 134 is formed by a sputtering method. A thickness of the source electrode 134 is 4 µm, for example. The source electrode 134 is made of aluminum-based metal (an Al—Cu-based alloy, for example).

The drain electrode 136 is formed on (a surface of) the low-resistance semiconductor layer 112. The drain electrode 136 is formed of a multilayered metal film such as a Ti—Ni—Au layer. A total thickness of the multilayered metal film is 0.5 µm, for example.

Crystal defects whose density is increased locally as viewed along a depth direction are formed in the n-type column regions 113 and the p-type column regions 115.

Figure 1B:
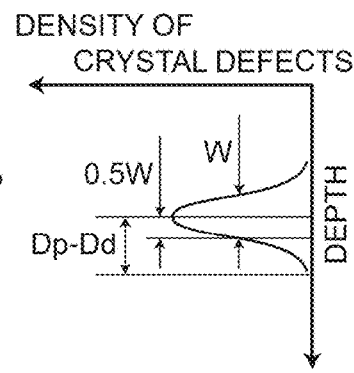

Using the first main surface as a reference and assuming a depth to a deepest portion of the super junction structure as Dp, a depth at which density of crystal defects exhibits a maximum value (see marks × in FIG. 1A) as Dd, and a half value width of density distribution of crystal defects as W, a relationship of $0.25Dp \leq Dd < 0.95Dp$ and a relationship of $0.05Dp < W < 0.5Dp$ are satisfied (see FIG. 1A and FIG. 1B). In the MOSFET 100, a relationship of $0.1Dp \leq W \leq 0.5Dp$ is also satisfied.

In this specification, "a depth to a deepest portion of the super junction structure" means a depth to a deepest portion of a region where the n-type column regions and the p-type column regions form a super junction structure using the first main surface as a reference. Accordingly, a depth to the deepest portion of the super junction structure substantially becomes equal to a depth to the deepest portion of the n-type column region or the p-type column region having a shallower maximum depth. As described above, in this embodiment 1, the depth to the deepest portion of the super junction structure is equal to the depth to the deepest portion of the p-type column region 115.

The first main surface in the MOSFET 100 forms a boundary surface between the base region 116 and the interlayer insulation film 126 and hence, the depth of the super junction structure also includes the depth of the base region 116. In general, the depth of the base region is extremely shallow compared to the depth to the deepest portion of the trench-gate structure including the gate electrode and hence, there arises no problem even when the depth of the base region 116 is included in the depth to the deepest portion of the super junction structure.

"Crystal defects whose density is increased locally as viewed along a depth direction" are formed by He irradiation or proton irradiation as described in a method of manufacturing a semiconductor device described later.

In this specification, "irradiation" means injecting ionized He or protons (hydrogen ions) into an object (a portion which forms a semiconductor base substrate after manufacturing a MOSFET) for forming crystal defects.

In the MOSFET 100 according to the embodiment 1, a relationship of $0.4Dp \leq Dd < 0.9Dp$ is further satisfied.

In the MOSFET 100 according to the embodiment 1, a relationship of $(Dp-Dd) > 0.5W$ is also satisfied.

In the embodiment 1, Dd is specifically 0.6Dp.

In the embodiment 1, W is specifically 0.3Dp.

In the embodiment 1, Dp−Dd is specifically 0.4Dp, and is more specifically 0.5W is 0.15Dp.

The respective drawings are schematic views. Particularly, for facilitating the understanding of the structure on a first main surface side, a ratio of a depth of the base region 116 with respect to a depth of the super junction structure is indicated larger than an actual rate of the depth of the base region 116. Accordingly, setting of numerical values relating to the above-mentioned Dd, W, and Dp−Dd and the indication of Dd, W, and Dp−Dd in FIG. 1A do not accurately correspond to each other. The same understanding is applicable to FIG. 3, FIG. 7A, FIG. 8A, FIG. 9A, and FIG. 10A described later.

Hereinafter, the reason why the relationship of $0.25Dp \leq Dd < 0.95Dp$ and the relationship of $0.4Dp \leq Dd < 0.9Dp$ are established are explained with reference to FIG. 2. MOSFETs described hereinafter have basically substantially the same configuration as the MOSFET 100 according to the embodiment 1 except for the presence or non-presence of crystal defects and the position of the crystal defect. Further, it is assumed that the condition of $0.05Dp < W < 0.3Dp$ is satisfied with respect to the MOSFET where crystal defects are formed.

The graph of the comparative example 1 relates to a MOSFET where the MOSFET has a super junction structure and crystal defects are not formed in the MOSFET. It is understood from the graph of the comparative example 1 that a reverse recovery current (Irr) becomes rapidly small (dIr/dt being increased) after the reverse recovery current (Irr) passes a peak value (Irp, see an intersecting point between the graph of the comparative example 1 and a chain line indicated by symbol P1) (the reverse recovery current (Irr) being in a hard recovery state). Further, from the graph of the comparative example 1, it is also understood that the peak value (Irp) of the reverse recovery current is relatively large and a reverse recovery time (Trr) is relatively long and hence, a reverse recovery charge amount (Qrr) is also relatively large.

The graph of the comparative example 2 relates to a MOSFET where a depth Dd at which density of crystal defects exhibits a maximum value is on a slightly more first main surface side than a deepest portion of the super junction structure (between Dd−Dp to 0.95Dp in the above-mentioned formula, and approximately 0.95Dp). From the graph of the comparative example 2, the following is understood. Compared to the comparative example 1, the peak value of the reverse recovery current (Irp, see an intersecting point between the graph of the comparative example 2 and a chain line indicated by symbol P2) becomes small and a reverse recovery time (Trr) becomes short. Accordingly, although a reverse recovery charge amount (Qrr) can be largely reduced, compared to the comparative example 1, a time change rate (dIr/dt) of a reverse recovery current after the reverse recovery current passes a peak value (Irp) is increased (the reverse recovery current being in a hard recovery state). It is also understood from a waveform of the graph of the comparative example 2 that oscillation is generated.

From a viewpoint of suppressing oscillation, as in the case of the comparative example 2, there is a tendency that an oscillation suppressing effect becomes disadvantageous compared to the case where crystal defects are not formed substantially using a depth where a depth Dd at which density of crystal defects exhibits a maximum value becomes 0.95Dp as a boundary.

The graph of an example 1 relates to a MOSFET where a depth Dd at which density of crystal defects exhibits a maximum value is on a relatively first main surface side of the super junction structure (p-type column region) (Dd=0.25Dp approximately in the above-mentioned formula). From the graph of the example 1, it is understood that, compared to the graph relating to the comparative example 1, a peak value of a reverse recovery current (see Irp, an intersecting point between the graph of the example 1 and a chain line indicated by symbol P3) becomes small and a reverse recovery time (Trr) is shortened so that a reverse recovery charge amount (Qrr) can be reduced. It is also understood that a time change rate (dIr/dt) of a reverse recovery current after the reverse recovery current passes a peak value (Irp) becomes small compared to the comparative example 1 and the comparative example 2 (the reverse recovery current being in a soft recovery state). It is also understood from a waveform of the graph of the example 1 that the generation of oscillation after a reverse recovery can be suppressed compared to the comparative example 2.

From a viewpoint of sufficiently reducing a time change rate (dIr/dt) of a reverse recovery current after the reverse recovery current passes the peak value (Irp), as in the case of the example 1, a substantial difference (a significant difference when viewed as a product) appears between the MOSFET of the example 1 and a MOSFET where crystal defects are not formed from the depth where the depth Dd at which density of crystal defects exhibits a maximum value becomes 0.25Dp.

The graph of an example 2 relates to a MOSFET where a depth Dd at which density of crystal defects exhibits a maximum value is at an is portion of the super junction structure (Dd=0.5Dp approximately in the above-mentioned formula). From the graph of the example 2, it is understood that, compared to the graph of the comparative example 1 or the graph of the example 1, a peak value of a reverse recovery current (see Irp, an intersecting point between the graph of the example 2 and a chain line indicated by P4) becomes smaller and a reverse recovery time (Trr) is further shortened so that a reverse recovery charge amount (Qrr) can be further reduced. It is also understood that a time change rate (dIr/dt) of a reverse recovery current after the reverse recovery current passes a peak value (Irp) becomes further small compared to the comparative example 1. It is also understood from a waveform of the graph of the example 2 that the generation of oscillation after reverse recovery can be suppressed.

Hereinafter, a phenomenon is explained with reference to FIG. 3 and FIG. 4A to FIG. 4E where a time change rate (dIr/dt) of a reverse recovery current after the reverse recovery current passes a peak value (Irp) is further rapidly increased in the case where a depth Dd at which density of crystal defects exhibits a maximum value is 0.95Dp or more, particularly, equal to or more than Dp. Assume that, unless otherwise specified, a MOSFET described hereinafter alas basically substantially the same configuration as the MOSFET 100 according to the embodiment 1 except for the presence or non-presence of crystal defects or the position of the crystal defects.

In a depth region between an area in the vicinity of a deepest portion of the super junction structure and the low-resistance semiconductor layer (the depth region ranging from an area in the vicinity of bottom portions of the p-type column regions to a buffer layer of an n-type), a so-called "carrier pool" is formed at the time of reverse recovery due to a reason and a mechanism described hereinafter.

Figure 3:
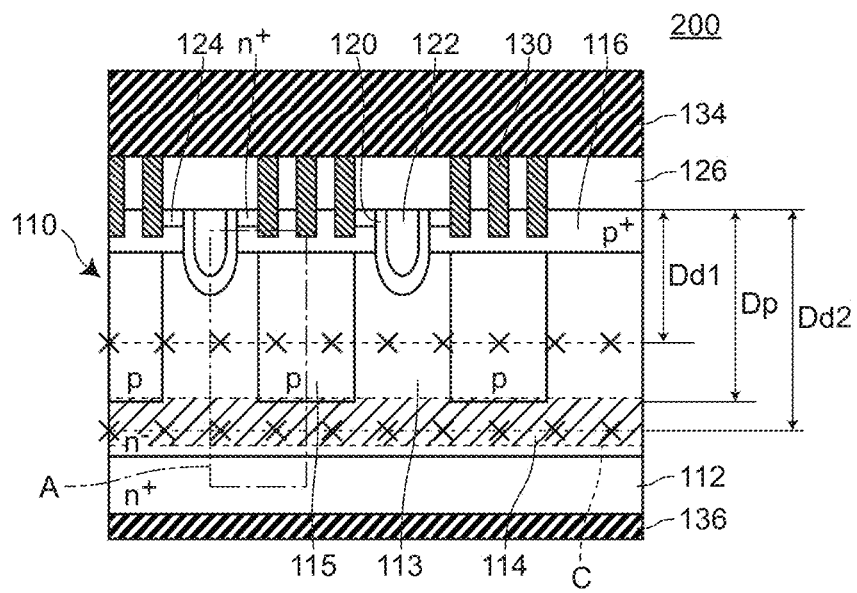
FIG. 3 is a cross-sectional view showing a portion of a MOSFET 200 for describing a carrier pool. In the MOSFET 200, two depths at which density of crystal defects exhibits a maximum value are described (see symbol Dd1 and symbol Dd2). However.

The MOSFET 200 shown in FIG. 3 is provided for describing a relationship between the depth Dp at which density of crystal defects exhibits a maximum value and the carrier pool. A region indicated by a symbol C in FIG. 3 is a region where the carrier pool is liable to be formed.

The formation of the carrier pool is further described with reference to FIG. 4A to FIG. 4E.

Figures 4A, 4B, 4C, 4D, 4E:
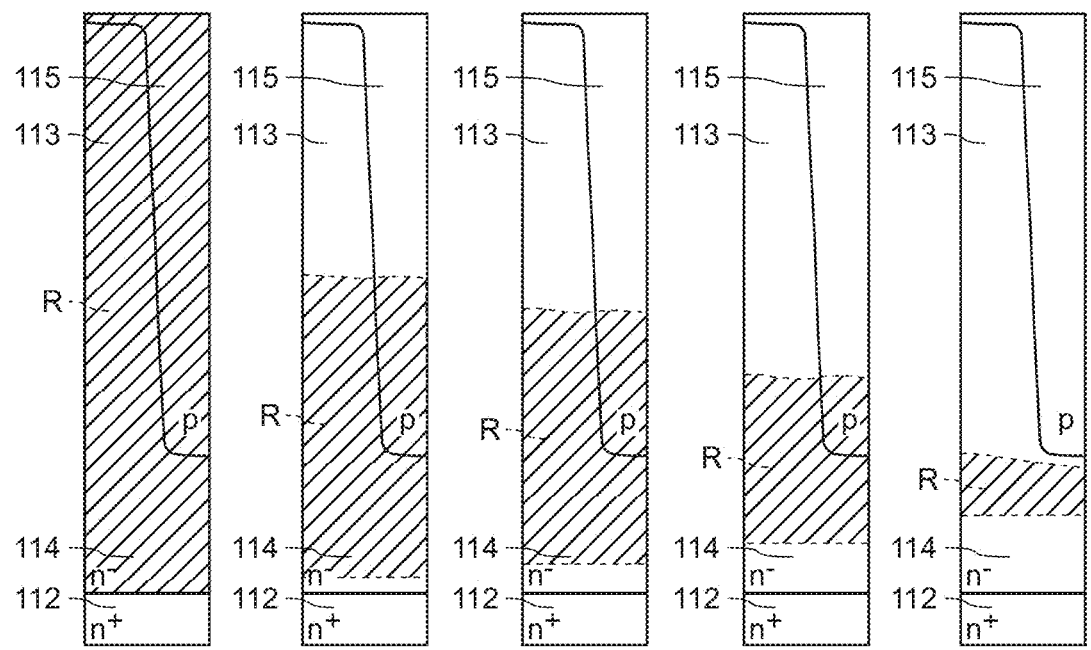
FIG. 4A to FIG. 4E are views for describing the formation of the carrier pool. A region indicated by symbol R is a region where density of holes (electron holes) is high (density of a carrier being high)

First, when a forward bias is applied to the body diode and a forward current flows in the body diode, due to conductivity modulation, electrons and holes of the same number are distributed to be filled over the whole area of the n-type column region, the p-type column region, and the buffer layer (see FIG. 4A).

Next, when the body diode enters a reverse recovery process, the holes are drawn to the first main surface side, and electrons are drawn to a side opposite to the first main surface (see FIG. 4B, FIG. 4C, FIG. 4D, FIG. 4E). In such a phenomenon, a moving speed of the holes is lower than a moving speed of electrons and hence, the holes become a speed limiting factor for drawing of the carriers. Since the holes are drawn from a first main surface side and hence, in a region close to a side opposite to the first main surface (relatively remote from the first main surface), that is, in a depth region between an area in the vicinity of the deepest portion of the super junction structure and the low-resistance semiconductor layer (a depth region ranging from an area in the vicinity of the bottom portions of the p-type column regions to a buffer layer of an n-type), the holes remain even at a last stage (see FIG. 4E). Further, a charge neutral condition is satisfied and hence, substantially the same number of electrons also remain in the region of substantially the same depth.

In accordance with the above-mentioned mechanism, remaining holes and electrons form "carrier pool".

In such a process, by adopting the structure where carriers are drawn little by little from the carrier pool formed as described above, a time change rate (dIr/dt) of a reverse recovery current after the reverse recovery current passes a peak value (Irp) can be made small.

However, when the electrons and the holes remaining in the carrier pool are recoupled, a reverse recovery current (Irr) is rapidly decreased and hence, a time change rate (dIr/dt) of a reverse recovery current after the reverse recovery current passes a peak value (Irp) is increased thus generating oscillation.

Accordingly, when the depth Dd at which density of crystal defects exhibits a maximum value is 0.95Dp or more, especially, when the depth Dd fails within a depth region between the deepest portion of the super junction structure and the low-resistance semiconductor layer (see Dd2 in FIG. 3), recoupling of electrons and holes in the crystal defects is accelerated. Although such acceleration of recoupling is favorable for shortening a reverse recovery time (Trr), a lifetime of carriers in the carrier pool becomes excessively short and hence, a time change rate (dIr/dt) of a reverse recovery current after the reverse recovery current passes a peak value (Irp) is increased whereby oscillation is liable to be generated.

In the case where the depth Dd at which density of the crystal defects exhibits a maximum value overlaps with a region where the carrier pool is liable to be formed, a reverse recovery characteristic is strongly affected by density and the position of the crystal defects and hence, an effect attributed to irregularities in the density and the position of the crystal defects becomes conspicuous. Accordingly, in the case where the depth Dd at which density of the crystal defects exhibits a maximum value is 0.95Dp or more, it is considered that a reverse recovery characteristic largely changes depending on semiconductor devices thus giving rise to a case where such setting of the depth is not suitable for the mass production of the semiconductor devices.

On the other hand, in the case where the depth Dd at which density of crystal defects exhibits a maximum value is set smaller than 0.95Dp, the crystal defects exist on a first main surface side of the region where a carrier pool is liable to be generated (see Dd1 in FIG. 3) and hence, there is no possibility that the crystal defects accelerate rapid recoupling of carriers remaining in the carrier pool. Accordingly, compared to the conventional semiconductor devices, a time until carriers existing in the vicinity of the deepest portion of the super junction structure are recoupled becomes relatively long and hence, it is possible to suppress a rapid growth of a depletion layer from a pn junction at the time of reverse recovery of the body diode.

As a result, according to the semiconductor device of the present invention, it is possible to suppress the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component. As a result, the semiconductor device according to the present invention becomes a semiconductor device where oscillation is not easily generated compared to conventional semiconductor devices.

In the case where crystal defects reach the low-resistance semiconductor layer 112 of an n$^+$-type, since the low-resistance semiconductor layer 112 is originally a region where a lifetime of carriers is short, an effect of performing a lifetime control cannot be substantially acquired whereby the formation of crystal defects has no significance. In this case, it is considered that the semiconductor device has substantially the same reverse recovery characteristic as a semiconductor device where crystal defects are not formed.

To describe for the confirmation purpose, it is not always the case that a MOSFET where the depth Dd at which density of crystal defects exhibits a maximum value is set to a depth between an area in the vicinity of a bottom portion of the super junction structure (an area at a bottom portion of the p-type column region) and a low-resistance semiconductor layer cannot be practically used. In consideration of the structure or usage (configuration of a circuit or the like) of the MOSFET, in the case where it is unnecessary to suppress the generation of oscillation or such necessity is low, and a reverse recovery time (Trr) and a peak current (Irp) and a reverse recovery charge (Qrr) at the time of reverse recovery are desired to be as small as possible, such a MOSFET can be sufficiently practically used.

For example, in a step-up chopper of a current discontinuous type or of a current critical type, a path of a reverse recovery current of a free wheel diode passes a reactor and hence, a rapid change in a current is suppressed by the reactor. In this case, it is safe to say that necessity of suppressing the generation of oscillation is low.

Based on the above-mentioned findings, a range of Dd (a relationship relating to Dd) is set to satisfy a relationship of 0.25Dp≤Dd<0.95Dp. Based on the above-mentioned findings, a preferably reasonably derived range of Dd (the relationship relating to Dd) is set to satisfy a relationship of 0.4Dp≤Dd<0.9Dp.

The reason that the relationship of W<0.5Dp is set is as follows. When the distribution of crystal defects is excessively large, carriers are recoupled over a wide range formed of the p-type column regions and the n-type column regions (also including the buffer layer when the buffer layer also exists) and hence, eventually, a reverse recovery current (Irr) becomes further rapidly small (dIr/dt being increased) after the reverse recovery current (Irr) passes a peak value (Irp).

On the other hand, the reason that the relationship of 0.05Dp<W is set is that when the distribution of crystal defects is excessively narrow, a region where carriers are recoupled cannot be sufficiently ensured. From a viewpoint of ensuring a region where carriers are recoupled, it is further preferable that a relationship of 0.1Dp≤W be satisfied.

The reason that (Dp−Dd)>0.5W is adopted as the preferable range (a relationship relating to W) is as follows. When W which is density distribution of crystal defects is large in the case where a depth at which density of crystal defects exhibits a maximum value is deep (the case where Dp−Dd is small), a large amount of crystal defects exists at the position deeper than the super junction structure and hence, eventually, there arises a case where a reverse recovery current (Irr) becomes further rapidly small (dIr/dt being increased) after the reverse recovery current (Irr) passes a peak value (Irp).

2. Method of Manufacturing Semiconductor Device

Next, a method of manufacturing a semiconductor device according to the embodiment 1 is described.

The method of manufacturing a semiconductor device according to the embodiment 1 is a method of manufacturing the MOSFET 100 according to the embodiment 1.

The method of manufacturing a semiconductor device according to the embodiment 1 includes: a preparation step S1; a crystal defect forming step S2; an annealing step S3; a back grinding step S4; and a drain electrode forming step S5 in the following order.

Figure 5A:
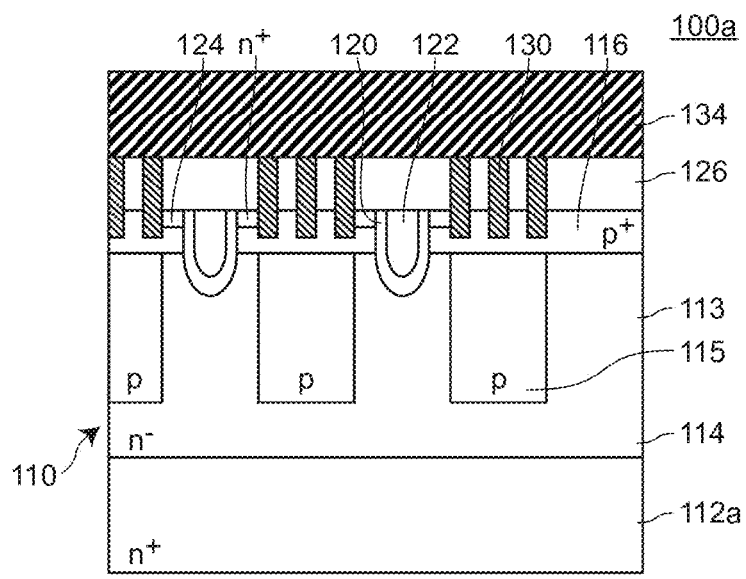
FIG. 5A and FIG. 5B are views for describing a method of manufacturing a semiconductor device according to the embodiment 1.

As shown in FIG. 5A, the preparation step S1 is a step in which a predetermined structural body 100a is prepared. The predetermined structural body 100a includes: the semiconductor base substrate 110 which has the n-type column regions 113 and the p-type column regions 115 and in which a super junction structure is formed of the n-type column regions 113 and the p-type column regions 115; and the gate electrodes 122 which are formed on the first main surface side of the semiconductor base substrate 110 by way of the gate insulation film 120.

In this specification, "predetermined structural body" means a structural body where at least crystal defects are not formed compared to the semiconductor device of the present invention. The predetermined structural body may not include the constitutional elements to be provided to the semiconductor device of the present invention in addition to a point that crystal defects are not formed provided that the predetermined structural body includes: a semiconductor base substrate in which a super junction structure is formed of n-type column regions and p-type column regions; and a gate electrode formed by way of a gate insulation film.

Compared to the MOSFET 100, the predetermined structural body 110a according to the embodiment 1 does not include the drain electrode 136 in addition to the point that crystal defects are not formed. Further, the portion (see symbol 112a) which becomes the low-resistance semiconductor layer 112 when the predetermined structural body 110a is formed into the MOSFET 100 has a large thickness compared to the low-resistance semiconductor layer 112 of the MOSFET 100. It is also safe to say that the predetermined structural body 110a is a structural body where the structure of the MOSFET 100 on a first main surface side is completed.

The preparation step S1 can be performed by using a known step used in a method of manufacturing a known semiconductor device (MOSFET). As an example, the predetermined structural body 110a can be prepared in accordance with the following steps in the following order consisting of: (1) a step of preparing a semiconductor base substrate 110; (2) a step of forming trenches for gate electrodes 122; (3) a step of forming the gate electrodes 122; (4) a step of forming a base region 116; (5) a step of forming source regions 124; (6) a step of forming an interlayer insulation film 126; (7) a step of forming contact holes for metal plugs 130; (8) a step of forming the metal plugs 130; and (9) a step of forming a source electrode 134. The respective steps can be performed using known methods and hence, the detailed explanation of the respective steps is omitted.

In the embodiment 1, the drain electrode 136 is not formed in the preparation step S1.

A thickness of the portion 112a which becomes the low-resistance semiconductor layer 112 is adjusted by grinding the semiconductor layer of an n$^+$-type formed thick by a conventional back grinding method, for example.

Figure 5B:
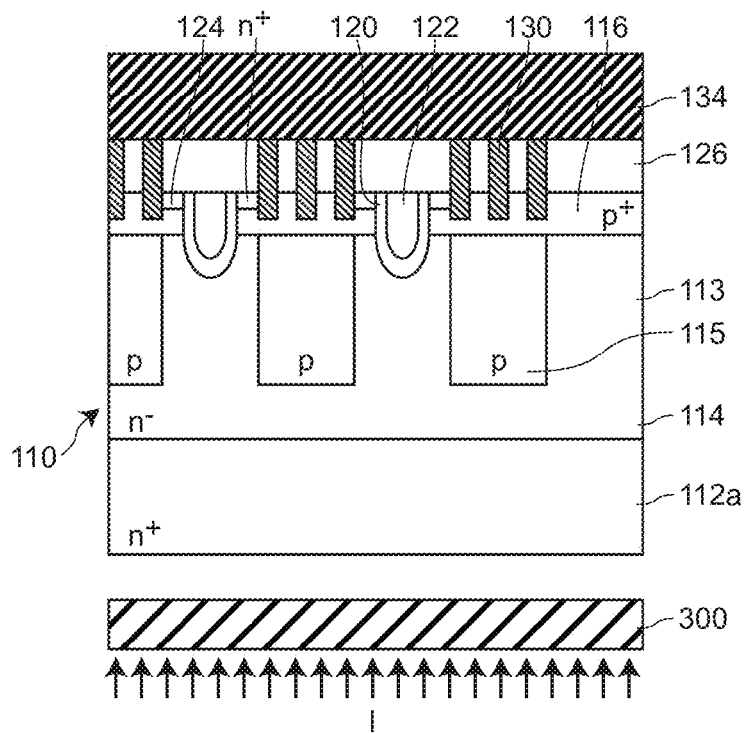

As shown in FIG. 5B, the crystal defect forming step S2 is a step of forming crystal defects in the n-type column regions 113 and the p-type column regions 115 such that density of the crystal defects is increased locally as viewed along a depth direction.

In the crystal defect forming step S2, crystal defects are formed such that, using the first main surface as a reference and assuming a depth to a deepest portion of the super junction structure (the depth of the p-type column region 115) as Dp, a depth of the depth position at which density of the crystal defects exhibits a maximum value as Dd, and a half value width of density distribution of the crystal defects as W, a relationship of 0.25Dp≤Dd<0.95Dp and a relationship of 0.05Dp<W<0.5Dp are satisfied.

In the crystal defect forming step S2 in the embodiment 1, the crystal defects are formed such that a relationship of 0.4Dp≤Dd<0.9Dp is satisfied.

In the crystal defect forming step S2 in the embodiment 1, the crystal defects are formed such that a relationship of (Dp−Dd)>0.5W is satisfied.

In the crystal defect forming step S2 in the embodiment 1, Dd is specifically 0.6Dp.

In the crystal defect forming step S2, crystal defects are formed by He irradiation or proton irradiation from a side opposite to the first main surface.

With respect to the depth Dd at which density of crystal defects exhibits a maximum value, for example, the depth can be adjusted based on energy of He irradiation or proton irradiation and using an absorber 300 (a member which adjusts a flying distance of He or protons by allowing He or protons to pass therethrough). The absorber 300 is made of aluminum, for example.

The use of the absorber 300 is not always necessary in the adjustment of the depth Dd at which density of crystal defects exhibits a maximum value (adjustment of a flying distance of ion species).

First, assume a distance as viewed along a depth direction from a surface (back surface) of the portion 112a which becomes the low-resistance semiconductor layer 112 on a side opposite to a first main surface to the depth Dd at which density of crystal defects exhibits a maximum value as Dbd. With respect to predetermined irradiation energy in the He irradiation or in the proton irradiation, in the case where a flying distance Rp in a material (silicon) which forms the predetermined structural body 110a is equal to the distance Dbd or in the case where a thickness of the portion 112a which becomes the low-resistance semiconductor layer 112 is adjusted such that the flying distance Rp becomes equal to the distance Dbd, crystal defects can be formed at a proper depth without using the absorber 300.

The case where the absorber 300 becomes necessary is the case where a relationship of Rp>Dbd is satisfied. In this case, the absorber 300 having a thickness at which a speed reduction amount of ion species in the absorber 300 becomes equal to a speed reduction amount in silicon having a thickness substantially obtained by Rp−Dbd (a thickness obtained using a conversion coefficient) is used.

For example, in the case where a material which forms the semiconductor base substrate 110 is silicon, and the absorber 300 made of aluminum is used, a conversion coefficient from silicon to aluminum is a value slightly lower than 1 and hence, as described above, the thickness of the absorber 300 is set slightly smaller than the thickness obtained by Rp−Dbd.

In the case where a relationship of Rp<Dbd is established, the depth Dd at which density of crystal defects exhibits a maximum value cannot be properly adjusted by the absorber 300 and hence, it is necessary to decrease a thickness of the portion 112a which becomes the low-resistance semiconductor layer 112 by back grinding or the like.

A half value width of density distribution of crystal defects can be adjusted based on energy of He irradiation or proton irradiation. The half value width of density distribution of crystal defects can be decreased by decreasing such energy, and the half value width of density distribution of crystal defects can be increased by increasing such energy.

A dose amount of He irradiation or proton irradiation falls within a range of $5\times10^{10}$/cm$^2$ to $2\times10^{12}$/cm$^2$.

Energy of He irradiation or proton irradiation differs depending on a thickness of the predetermined structural body 110a or ion species to be used. However, in general, such energy is set to a value which fails within a range of 1 MeV to 40 MeV, for example.

As main ion species which can be used in He irradiation, $^3$He$^{2+}$, $^4$He$^{2+}$, $^3$He$^+$, and $^4$He$^+$ can be named.

The annealing step S3 is a step where annealing is performed at a temperature of 300° C. to 500° C. (not shown in the drawing). By performing annealing, undesired crystal defects attributed to He irradiation or proton irradiation can be extinguished and, at the same time, density of crystal defects can be adjusted. From a viewpoint of acquiring a sufficient annealing effect and from a viewpoint of leaving a sufficient amount of crystal defects, it is preferable that an annealing time be 0.5 hours to 5 hours. It is more preferable that the annealing time be 1 hour to 2 hours.

In the case where a polyimide-based resin is used on a first main surface side of the predetermined structural body 100a (particularly, a peripheral region), it is preferable to set an annealing temperature to 350° C. or below for preventing degradation or the like of the polyimide-based resin.

Figure 6A:
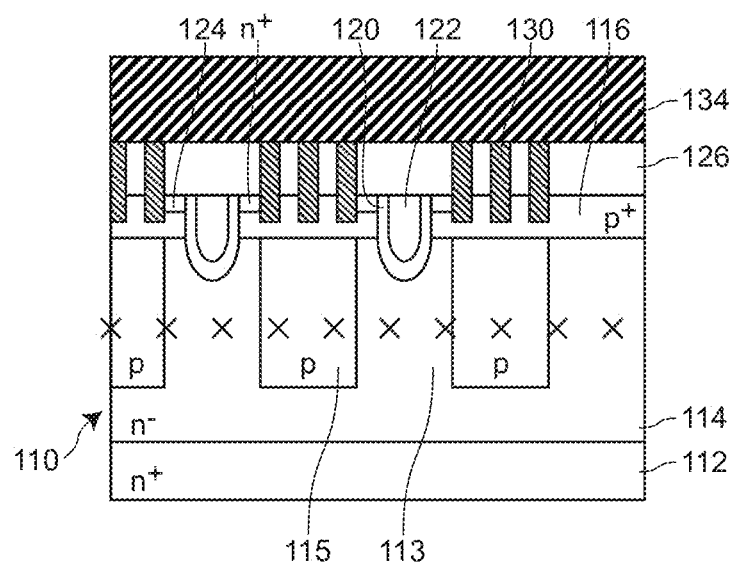
FIG. 6A and FIG. 6B are views for describing the method of manufacturing a semiconductor device according to the embodiment 1.

As shown in FIG. 6A, the back grinding step S4 is a step of forming the low-resistance semiconductor layer 112 by reducing a thickness of the portion 112a which becomes the low-resistance semiconductor layer 112. The back grinding step S4 also has an effect of cleaning a surface of the low-resistance semiconductor layer 112.

In the case where a thickness of the portion 112a which becomes the low-resistance semiconductor layer 112 is already proper, and a surface of the low-resistance semiconductor layer 112 is sufficiently clean (adhesion of smears or the like being sufficiently small), this step may be omitted.

Figure 6B:
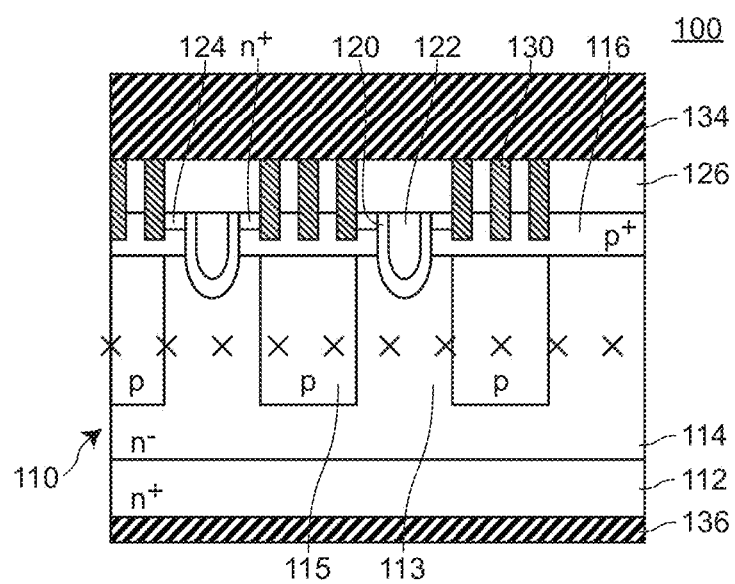

As shown in FIG. 6B, the drain electrode forming step S5 is a step of forming the drain electrode 136 by forming a metal film on the low-resistance semiconductor layer 112.

The MOSFET 100 which is the semiconductor device according to the embodiment 1 can be manufactured in accordance with the above-mentioned steps.

3. Advantageous Effects Acquired by Semiconductor Device (MOSFET 100) and Method of Manufacturing Semiconductor Device According to the Embodiment 1

Hereinafter, advantageous effects acquired by the semiconductor device (MOSFET 100) and the method of manufacturing a semiconductor device according to the embodiment 1 are described.

According to the MOSFET 100 of the embodiment 1, crystal defects whose density is increased locally as viewed along a depth direction are formed in the n-type column regions 113 and the p-type column regions 115. Accordingly, in the same manner as the conventional semiconductor devices (MOSFETs), carriers can be recoupled at the crystal defects lifetime of carriers can be controlled) at the time of reverse recovery of a body diode. As a result, the carriers can be recovered even when the carriers do not move to an electrode. Accordingly, in the MOSFET 100 of the embodiment 1, a switching speed can be increased by shortening a reverse recovery time (Trr). As a result, a reverse recovery charge amount (Qrr) can be reduced thus providing a semiconductor device (MOSFET) which can reduce a recovery loss.

Further, according to the MOSFET 100 of the embodiment 1, the relationship of $0.25Dp \leq Dd < 0.95Dp$ is satisfied. Accordingly, compared to the conventional semiconductor devices (MOSFETs), a time until carriers existing in the vicinity of the deepest portion of the super junction structure are recoupled becomes relatively long and hence, it is possible to suppress a rapid growth of a depletion layer from a pn junction at the time of reverse recovery of the body diode. As a result, according to the MOSFET 100 of the embodiment 1, it is possible to suppress the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component. As a result, the MOSFET 100 according to the embodiment 1 becomes a semiconductor device (MOSFET) where oscillation is not easily generated compared to conventional semiconductor devices (MOSFETs).

Accordingly, the MOSFET 100 according to the embodiment 1 becomes a semiconductor device (MOSFET) which can reduce a recovery loss and in which oscillation is not easily generated compared to conventional semiconductor devices (MOSFETs).

Further, according to the MOSFET 100 of the embodiment 1, the relationship of $0.05Dp < W < 0.5Dp$ is satisfied. Accordingly, it is possible to prevent a phenomenon that carriers are recoupled over a wide range formed of the p-type column regions and the n-type column regions so that, eventually, a reverse recovery current (Irr) becomes further rapidly small (dIr/dt becoming large) after the reverse recovery current (Irr) passes a peak value (Irp) and, at the same time, it is possible to sufficiently control a lifetime of carriers by properly ensuring distribution of crystal defects.

Further, according to the MOSFET 100 of the embodiment 1, the relationship of $0.4Dp \leq Dd < 0.9Dp$ is satisfied.

Accordingly, a recovery loss can be further reduced and, at the same time, it is possible to provide the semiconductor device (MOSFET) where the generation of oscillation is further suppressed compared to conventional semiconductor devices (MOSFETs).

Further, according to the MOSFET 100 of the embodiment 1, the relationship of $(Dp-Dd) > 0.5W$ is satisfied. Accordingly, an amount of crystal defects existing at a position deeper than the super junction structure can be reduced and hence, it is possible to prevent the occurrence of a phenomenon where a reverse recovery current (Irr) eventually becomes further rapidly small (dIr/dt becoming large) after the reverse recovery current (Irr) passes a peak value (Irp) whereby it is possible to ensure a state where oscillation is minimally generated.

According to the method of manufacturing a semiconductor device of the embodiment 1, in the crystal defect forming step S2, crystal defects are formed such that the relationship of $0.25Dp \leq Dd < 0.95Dp$ is satisfied. Accordingly, the semiconductor device (MOSFET 100) which can reduce a recovery loss and in which oscillation is not easily generated compared to conventional semiconductor devices (MOSFETs) can be manufactured.

According to the method of manufacturing a semiconductor device of the embodiment 1, in the crystal defect forming step S2, crystal defects are formed so as to satisfy the relationship of $0.05Dp < W < 0.5Dp$. Accordingly, the semiconductor device (MOSFET 100) can be manufactured where it is possible to prevent a phenomenon that carriers are recoupled over a wide range formed of the p-type column regions and the n-type column regions so that, eventually, a reverse recovery current (Irr) becomes further rapidly small (dIr/dt becoming large) after the reverse recovery current (Irr) passes a peak value (Irp) and, at the same time, it is possible to sufficiently control a lifetime of carriers by properly ensuring distribution of crystal defects (by preventing narrowing of a region where the crystal defects are distributed).

According to the method of manufacturing a semiconductor device of the embodiment 1, in the crystal defect forming step S2, crystal defects are formed so as to satisfy the relationship of $0.4Dp \leq Dd < 0.9Dp$. Accordingly, a recovery loss can be further reduced and, at the same time, it is possible to manufacture the semiconductor device (MOSFET 100) where the generation of oscillation is further suppressed compared to conventional semiconductor devices (MOSFETs).

Further, according to the method of manufacturing a semiconductor device of the embodiment 1, in the crystal defect forming step S2, crystal defects are formed such that a relationship of $(Dp-Dd) > 0.5W$ is satisfied. Accordingly, it is possible to manufacture a semiconductor device (MOSFET 100) where an amount of crystal defects existing at a position deeper than the super junction structure can be reduced, it is possible to prevent the occurrence of a phenomenon where a reverse recovery current (Irr) eventually becomes further rapidly small (dIr/dt becoming large) after the reverse recovery current (Irr) passes a peak value (Irp), and it is possible to ensure a state where oscillation is minimally generated.

According to the method of manufacturing a semiconductor device of the embodiment 1, in the crystal defect forming step S2, crystal defects are formed by He irradiation or proton irradiation. Accordingly, proper crystal defects can be formed.

According to the method of manufacturing a semiconductor device of the embodiment 1, a dose amount of He irradiation or proton irradiation fails within a range of $5\times10^{10}/cm^2$ to $2\times10^{12}/cm^2$ and hence, density of the formed crystal defects can be set to a proper value.

According to the method of manufacturing a semiconductor device of the embodiment 1, the method further includes annealing step S3 where annealing is performed at a temperature of 300° C. to 500° C. after the crystal defect forming step S2. Accordingly, undesired crystal defects formed by He irradiation or proton irradiation can be extinguished, and density of the crystal defects can be adjusted.

Embodiment 2

Figure 7A:
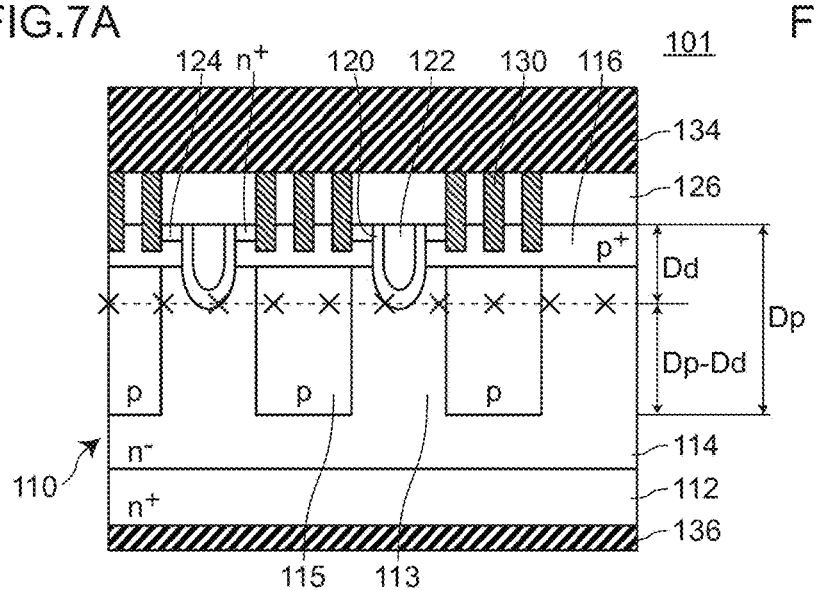
FIG. 7A and FIG. 7B are views for describing a MOSFET 101 according to an embodiment 2.
Figure 7B:
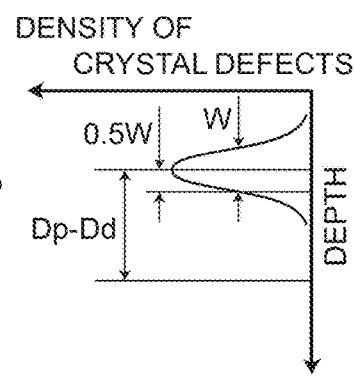

A MOSFET 101 according to the embodiment 2 basically has substantially the same configuration as the MOSFET 100 according to the embodiment 1. However, the MOSFET 101 according to the embodiment 2 differs from the MOSFET 100 according to the embodiment 1 with respect to a depth at which density of crystal defects exhibits a maximum value. That is, in the MOSFET 101 according to the embodiment 2, as shown in FIG. 7A and FIG. 7B, a depth Dd at which density of crystal defects exhibits a maximum value is smaller than the corresponding depth in the MOSFET 100 according to the embodiment 1. The depth Dd at which density of crystal defects exhibits a maximum value in the MOSFET 101 is specifically 0.25Dp.

In the MOSFET 101 according to the embodiment 2, Dd is 0.25Dp. Accordingly, a relationship of 0.25Dp≤Dd<0.95Dp is satisfied and a relationship of Dd≤0.5Dp is also satisfied. As a matter of course, the above-mentioned "Dd is 0.25Dp" is described for an exemplifying purpose. From a viewpoint that a relationship of Dd≤0.5Dp is satisfied, it is not always necessary that Dd is 0.25Dp, and it is sufficient that Dd be 0.5Dp or less (see the example 1 and the example 2 in the embodiment 1).

The above-mentioned MOSFET 101 can be manufactured by a method substantially equal to the method of manufacturing a semiconductor device according to the embodiment 1 except that crystal defects are formed such that, a relationship of Dd=0.25Dp is satisfied in crystal defect forming step.

In the method of manufacturing a semiconductor device according to the embodiment 2, crystal defects are formed such that a relationship of Dd=0.25Dp is satisfied in crystal defect forming step. Accordingly, it is also safe to say that, in crystal defect forming step, crystal defects are formed so as to satisfy the relationship of 0.25Dp≤Dd<0.95Dp and to satisfy a relationship of Dd≤0.5Dp. The method of manufacturing a semiconductor device according to the embodiment 2 is a method of manufacturing the MOSFET 101. Accordingly, in the same manner as the MOSFET 101, "Dd is 0.25Dp" is described for an exemplifying purpose. From a viewpoint that a relationship of Dd≤0.5Dp is satisfied, it is not always necessary that Dd is 0.25Dp, and it is sufficient that Dd is 0.5Dp or less.

A depth at which density of crystal defects exhibits a maximum value can be adjusted, for example, by decreasing a thickness of an absorber 300 or by decreasing a thickness of a portion 112a of a low-resistance semiconductor layer 112 compared to crystal defect forming step S2 of the method of manufacturing a semiconductor device according to the embodiment 1.

In this manner, the MOSFET 101 according to the embodiment 2 differs from the MOSFET 100 according to the embodiment 1 with respect to the depth at which density of crystal defects exhibits a maximum value (shallow). However, the relationship 0.25Dp≤Dd<0.95Dp and the relationship of 0.05Dp<W<0.5Dp are satisfied. Accordingly, in the same manner as the MOSFET 100 according to the embodiment 1, it is possible to provide the semiconductor device (MOSFET) which can reduce a recovery loss and in which oscillation is not easily generated compared to the conventional semiconductor devices (MOSFETs).

Further, according to the method of manufacturing a semiconductor device of the embodiment 2, in the crystal defect forming step, crystal defects are formed such that the relationship of 0.25Dp≤Dd<0.95Dp and the relationship of 0.05Dp<W<0.5Dp are satisfied. Accordingly, it is possible to manufacture the semiconductor device which can reduce a recovery loss and in which oscillation is not easily generated compared to conventional semiconductor devices (MOSFETs). Method of manufacturing a semiconductor device according to the embodiments 3 to 5 described later have substantially the same advantageous effects.

"a relationship of Dd≤0.5Dp is satisfied" means that "a relationship of 0.25Dp≤Dd<0.5Dp is satisfied". Accordingly, in the semiconductor device (MOSFET 101) and the method of manufacturing the semiconductor device (MOSFET 101) according to the embodiment 2, advantageous effects acquired by "a relationship of Dd≤0.5Dp is satisfied" is substantially equal to advantageous effects acquired by "a relationship of Dd<0.95Dp is satisfied".

Embodiment 3

Figure 8A:
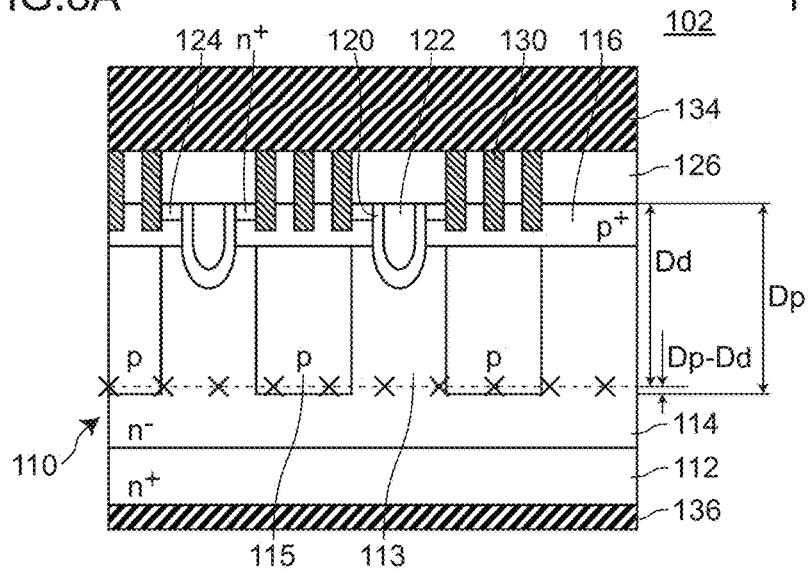
FIG. 8A and FIG. 8B are views for describing a MOSFET 102 according to an embodiment 3.
Figure 8B:
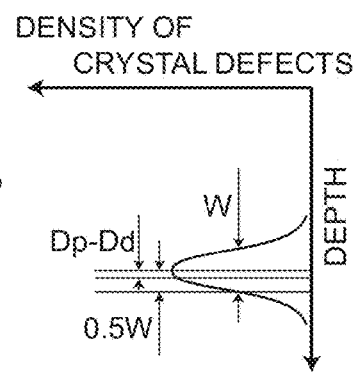

A MOSFET 102 according to the embodiment 3 basically has substantially the same configuration as the MOSFET 100 according to the embodiment 1. However, the MOSFET 102 according to the embodiment 3 differs from the MOSFET 100 according to the embodiment 1 with respect to a depth at which density of crystal defects exhibits a maximum value. That is, in the MOSFET 102 according to the embodiment 3, as shown in FIG. 8A and FIG. 8B, the depth Dd at which density of crystal defects exhibits a maximum value is deeper than the corresponding depth Dd in the MOSFET 100 according to the embodiment 1. In the MOSFET 102, the depth Dd at which density of crystal defects exhibits a maximum value is specifically 0.9Dp.

The MOSFET 102 according to the embodiment 3 does not satisfy a condition of (Dp−Dd)>0.5W. However, depending on the configuration of the semiconductor device (MOSFET), there is a case where the MOSFET 102 having such a configuration can also acquire a sufficient advantageous effect. Further, in the semiconductor device (MOSFET) corresponding to the embodiment 3, the density distribution of crystal defects may be narrowed so as to satisfy a condition of (Dp−Dd)>0.5W.

The above-mentioned MOSFET 102 can be manufactured by a method substantially equal to the method of manufacturing a semiconductor device according to the embodiment 1 except that crystal defects are formed such that a relationship of Dd=0.9Dp is satisfied in crystal defect forming step.

A depth at which density of crystal defects exhibits a maximum value can be adjusted, for example, by increasing a thickness of an absorber 300 or by increasing a thickness of a portion 112a of a low-resistance semiconductor layer 112 compared to crystal defect forming step S2 of the method of manufacturing a semiconductor device according to the embodiment 1.

In this manner, the MOSFET 102 according to the embodiment 3 differs from the MOSFET 100 according to the embodiment 1 with respect to the depth at which density of crystal defects exhibits a maximum value (deeper). However, the relationship of 0.25Dp≤Dd<0.95Dp and the relationship of 0.05Dp<W<0.5Dp are satisfied. Accordingly, in the same manner as the MOSFET 100 according to the embodiment 1, it is possible to provide the semiconductor device (MOSFET) which can reduce a recovery loss and in which oscillation is not easily generated compared to the conventional semiconductor devices (MOSFETs).

Embodiment 4

Figure 9A:
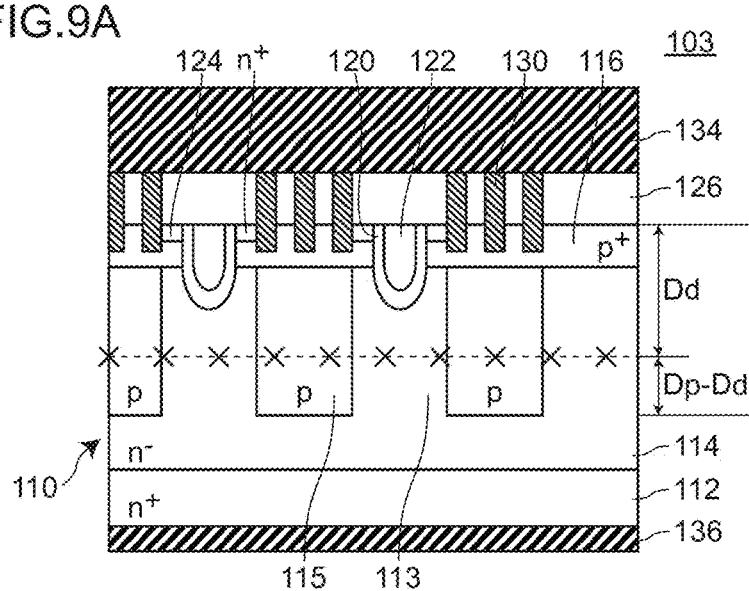
FIG. 9A and FIG. 9B are views for describing a MOSFET 103 according to an embodiment 4.
Figure 9B:
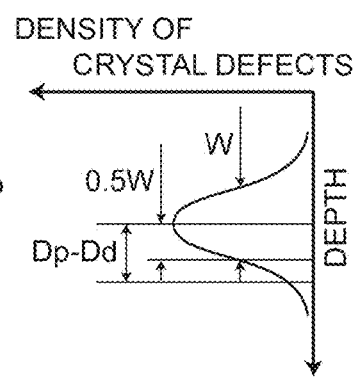

A MOSFET 103 according to the embodiment 4 basically has substantially the same configuration as the MOSFET 100 according to the embodiment 1. However, the MOSFET 103 according to the embodiment 4 differs from the MOSFET 100 according to the embodiment 1 with respect to a half value width W of density distribution of crystal defects. That is, in the MOSFET 103 according to the embodiment 4, as shown in FIG. 9A and FIG. 9B, the half value width W of density distribution of the crystal defects is larger than the corresponding half value width W in the MOSFET 100 according to the embodiment 1. The half value width W of density distribution of the crystal defects in the MOSFET 103 is slightly below 0.5Dp.

The above-mentioned MOSFET 103 can be manufactured by a method substantially equal to the method of manufacturing a semiconductor device according to the embodiment 1 except that crystal defects are formed where the half value width W is slightly below 0.5Dp in crystal defect forming step.

The half value width W can be adjusted by, for example, setting implantation energy larger than implantation energy used in the method of manufacturing a semiconductor device according to the embodiment 1.

In this manner, the MOSFET 103 according to the embodiment 4 differs from the MOSFET 100 according to the embodiment 1 with respect to the half value width W of density distribution of the crystal defects (larger). However, the relationship of 0.25Dp≤Dd<0.95Dp and the relationship of 0.05Dp<W<0.5Dp are satisfied. Accordingly, in the same manner as the MOSFET 100 according to the embodiment 1, it is possible to provide the semiconductor device (MOSFET) which can reduce a recovery loss and in which oscillation is not easily generated compared to the conventional semiconductor devices (MOSFETs).

Embodiment 5

Figure 10A:
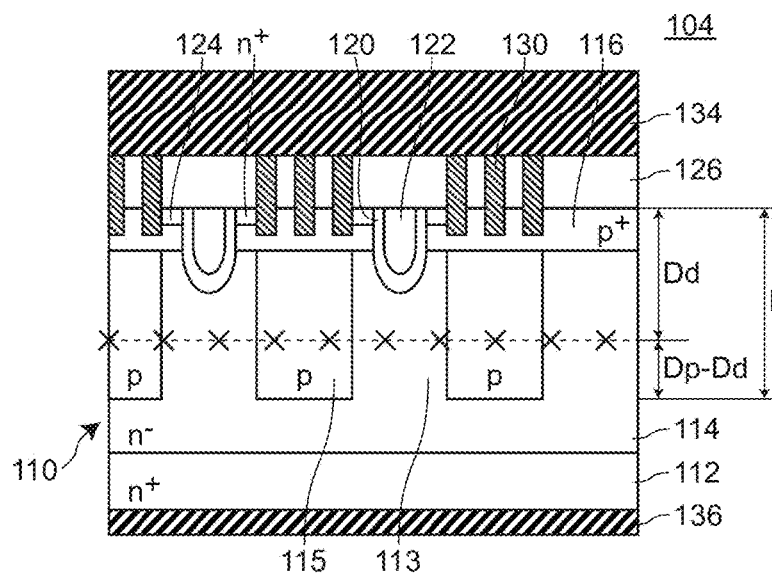
FIG. 10A and FIG. 10B are views for describing a MOSFET 104 according to an embodiment 5.
Figure 10B:
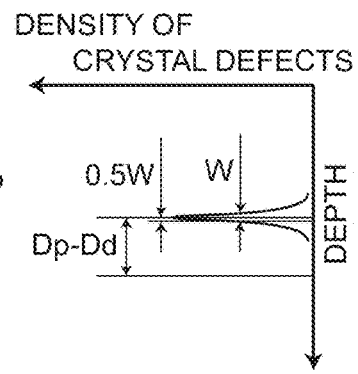

MOSFET 104 according to the embodiment 5 basically has substantially the same configuration as the MOSFET 100 according to the embodiment 1. However, the MOSFET 104 according to the embodiment 5 differs from the MOSFET 100 according to the embodiment 1 with respect to a half value width W of density distribution of crystal defects. That is, in the MOSFET 104 according to the embodiment 5, as shown in FIG. 10A and FIG. 10B, the half value width W of density distribution of the crystal defects is smaller than a half value width W of density distribution of the crystal defects in the MOSFET 100 according to the embodiment 1. A half value width W of density distribution of the crystal defects in the MOSFET 104 is slightly larger than 0.05Dp.

The MOSFET 104 having the above-mentioned configuration can be manufactured by a method substantially equal to the method of manufacturing a semiconductor device according to the embodiment 1 except that the half value width W of density distribution of the crystal defects is slightly larger than 0.05Dp.

The half value width W can be adjusted by, for example, setting implantation energy smaller than implantation energy used in the method of manufacturing a semiconductor device according to the embodiment 1.

In this manner, the MOSFET 104 according to the embodiment 5 differs from the MOSFET 100 according to the embodiment 1 with respect to the half value width W of density distribution of the crystal defect (smaller). However, in the MOSFET 104 according to the embodiment 5, a relationship of 0.25Dp≤Dd<0.95Dp and a relationship of 0.05Dp<W<0.5Dp are satisfied. Accordingly, in the same manner as the MOSFET 100 according to the embodiment 1, it is possible to provide the semiconductor device (MOSFET) which can reduce a recovery loss and in which oscillation is not easily generated compared to conventional semiconductor devices (MOSFETs).

Embodiment 6

In the embodiment 6, a relationship relating to a half value width W of density distribution of crystal defects is described from a viewpoint different from the viewpoint adopted by the embodiment 1.

Figure 11A:
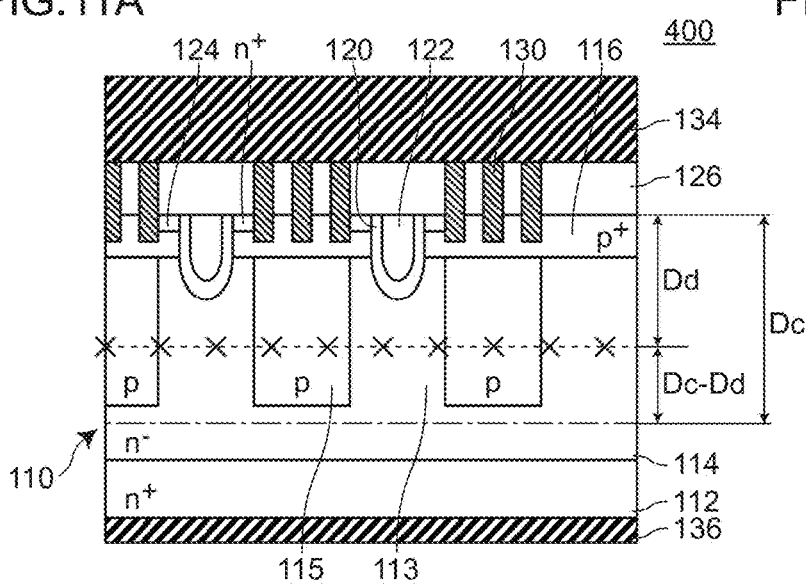
FIG. 11A and FIG. 11B are views for describing a MOSFET 400 according to an embodiment 6.
Figure 11B:
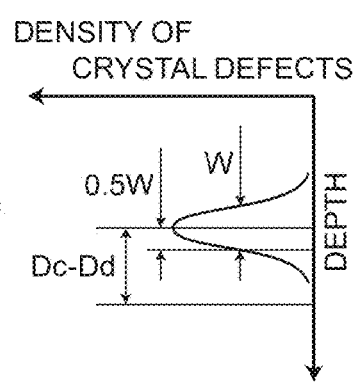

As shown in FIG. 11A and FIG. 11B, the configuration of a MOSFET 400 according to the embodiment 6 is substantially equal to the configuration of the MOSFET 100 according to the embodiment 1. The configuration of the MOSFET 400 is described for the convenience sake for simplifying the description. That is, the configuration of the MOSFET 100 also satisfy conditions described in the embodiment 6.

The MOSFET 400 according to the embodiment 6 may have the configuration which differs from the configuration of the MOSFET 100 provided that conditions described hereinafter are satisfied.

In the semiconductor device 400 according to the sixth embodiment, assuming semiconductor device having substantially the same configuration as the semiconductor device 400 excluding that the crystal defects are not formed as a base semiconductor device 400a (see FIG. 12A), and assuming a center depth of a region Rc where a carrier pool is formed when a reverse recovery current exhibits a peak value in a case where a reverse recovery operation is applied to the base semiconductor device 400a from a state that a body diode of the base semiconductor device 400a is biased forward so that a forward current which is ½ or more of a rated current flows as Dc, a relationship of |Dc−Dd|≤0.5W is satisfied as shown in FIG. 11A and FIG. 11B. Hereinafter, "the region Rc where a carrier pool is formed when a reverse recovery current exhibits a peak value in a case where a reverse recovery operation is applied to the base semiconductor device 400a from a state that a body diode of the base semiconductor device 400a is biased forward so that a forward current which is ½ or more of a rated current flows" is simply referred to as "the region Rc where a carrier pool is formed when a reverse recovery current exhibits a peak value" or "region Rc".

"a semiconductor device having the same configuration as the semiconductor device (of the present invention) excluding that the crystal defects are not formed", that is, "base semiconductor device" can be also referred to as "a semiconductor device having no crystal defects on a semiconductor base substrate" or "a semiconductor device to which a lifetime control is not performed" on a premise that the semiconductor device substantially has the same configuration as the semiconductor device of the present invention.

"a state that a body diode of the base semiconductor device is biased forward so that a forward current which is ½ or more of a rated current flows" can be also referred to as "a state where a forward current which is ½ or more of a rated current flows in a body diode of the base semiconductor device". Such a state is substantially equal to "when a body diode is biased forward so that a forward current flows" described in the embodiment 1 Although not described in the description of the embodiment 1 because of "a matter-of-course" nature, the above-mentioned "a body diode is biased forward so that a forward current flows" means that an amount of a forward current sufficient for a body diode of the semiconductor device (that is, the forward current being ½ or more of a rated current) flows.

In a state where the body diode is biased forward and a forward current which is ½ or more of a rated current flows in the base semiconductor device $400a$, due to conductivity modulation, electrons and holes of the same number are distributed to be filled over the whole areas of the n-type column regions, the p-type column regions, and the buffer layer (see FIG. 4A).

Figure 2:
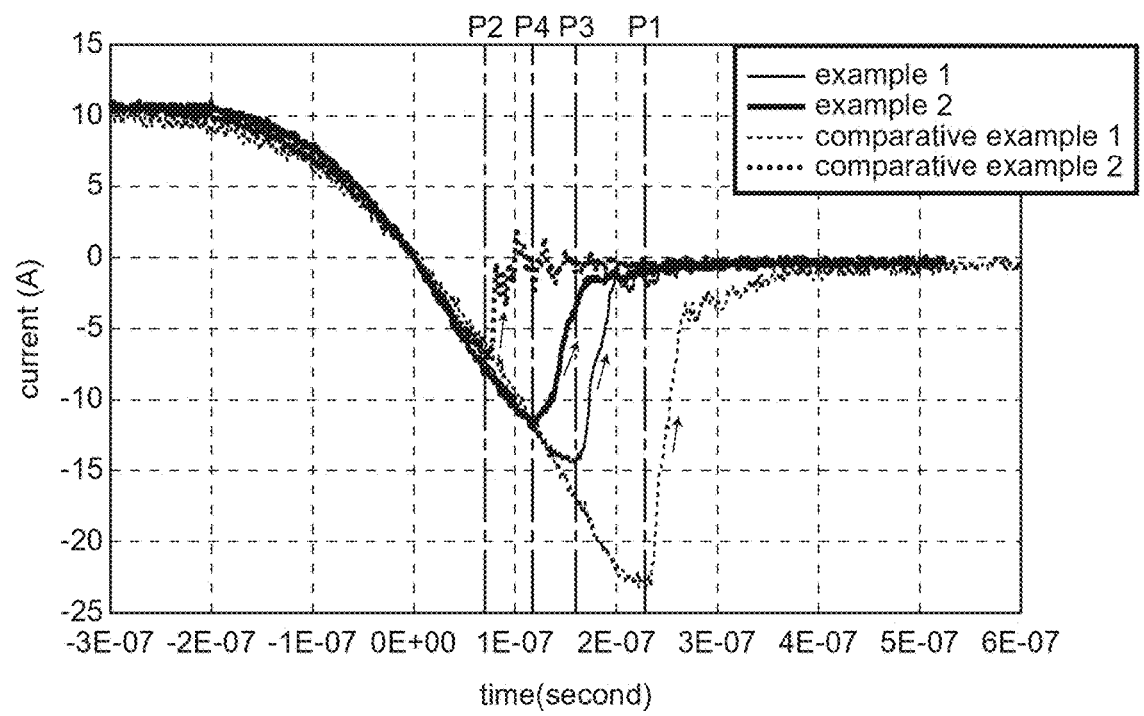
FIG. 2 is a view showing graphs for describing a relationship between a depth Dd at which density of crystal defects exhibits a maximum value and a reverse recovery current (Irr) at the time of reverse recovery of a body diode. The graphs shown in FIG. 2 indicate actually measured values in an experiment carried out under conditions considered proper. Accordingly, the graphs shown in FIG. 2 are not directly applicable to all MOSFETs. However, with respect to MOSFETs corresponding to the configurations of respective comparative examples and the configuration of respective examples described later, these MOSFETs exhibit substantially the same tendency as the graphs shown in FIG. 2. A current (assume a positive direction as a forward direction, unit: ampere) is taken on an axis of ordinates of the graph shown in FIG. 2, and time (unit: second) is taken on an axis of abscissas of the graph. Arrows on a right side of respective graphs shown in FIG. 2 indicate approximate dIr/dt (approximate gradients of the graphs after a reverse recovery current passes a peak value (Irp)) of the respective graphs. A chain line affixed with symbol P1 in FIG. 2 indicates the position of a peak value (Irp) of a reverse recovery current of a comparative example 1. A chain line affixed with symbol P2 indicates the position of a peak value (Irp) of a reverse recovery current of a comparative example 2. A chain line affixed with symbol P3 indicates the position of a peak value (Irp) of a reverse recovery current of an example 1. A chain line affixed with symbol P4 indicates the position of a peak value (Irp) of a reverse recovery current of an example 2.

"when a reverse recovery current exhibits a peak value in a case where a reverse recovery operation is applied to the base semiconductor device" means that, after the body diode enters a reverse recovery process, that is, at the time of reverse recovery of the body diode, a reverse recovery current (Irr) exhibits a peak value (see an intersecting point between the graph of the comparative example 1 and the chain line indicated by symbol P1 shown in FIG. 2 since the base semiconductor device $400a$ corresponds to the comparative example 1 in the embodiment 1).

"region where a carrier pool is formed when a reverse recovery current exhibits a peak value" is equal to "a region where a carrier pool is formed at the time of reverse recovery" described in the embodiment 1. In this embodiment, carriers are carriers which are injected by conductivity modulation in "a state that a body diode of the base semiconductor device is biased forward so that a forward current which is ½ or more of a rated current flows". The region may be also referred to as "a depth region where carriers which are injected by conductivity modulation remain".

As described in the above-mentioned embodiment 1, when the semiconductor device such as the base semiconductor device $400a$ enters a reverse recovery process, carriers are drawn to a first main surface side or to a side opposite to the first main surface (see FIG. 4B to FIG. 4E), and carriers which are not drawn and remain in the region form a carrier pool.

In this embodiment, assume the above-mentioned FIG. 4E shows a mode where a reverse recovery current (Irr) exhibits a peak value. In this case, the region R in the above-mentioned FIG. 4E becomes the region Rc where a carrier pool is formed when a reverse recovery current exhibits a peak value as shown in FIG. 12B.

Figure 12A:
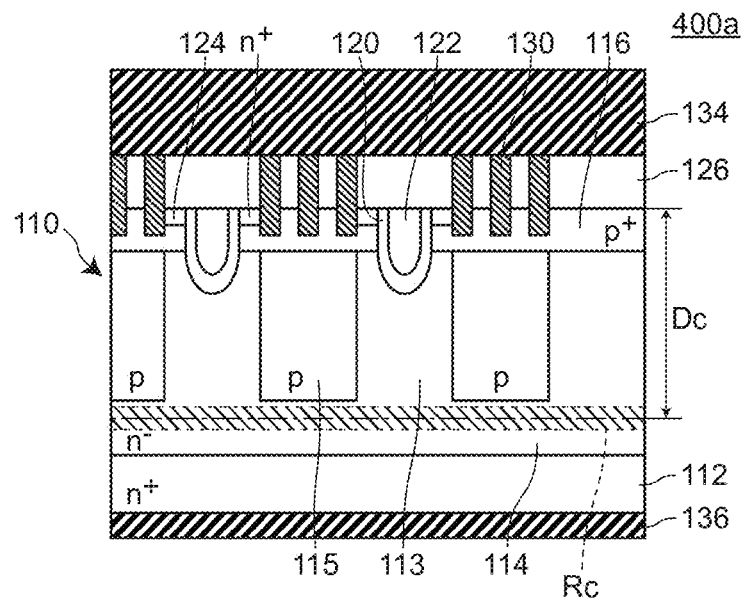
FIG. 12A and FIG. 12B are views for describing a base semiconductor device 400a according to the embodiment 6.
Figure 12B:
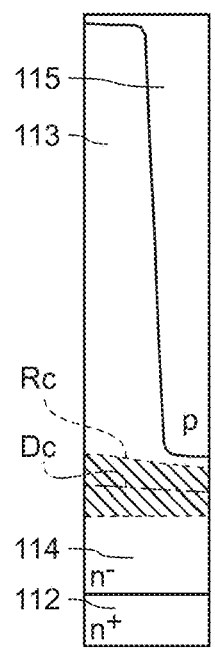

The region where a carrier pool is formed when a reverse recovery current exhibits a peak value is usually formed in a depth region between an area in the vicinity of the deepest portion of the super junction structure and the low-resistance semiconductor layer (see FIG. 12A and FIG. 12B).

The region indicated by a symbol C in FIG. 3 is "a region where a carrier pool is liable to be formed". Although this region overlaps with "region where a carrier pool is formed when a reverse recovery current exhibits a peak value", these regions are not the same region.

"a center depth of a region where a carrier pool is formed" is an intermediate depth between a depth of a deepest portion and a depth of a shallowest portion of a region where a carrier pool is formed (see FIG. 12A and FIG. 12B). The depth may be also referred to as "a depth of the center of a depth region where carriers remain". The depth may differ depending on a location (a position when the semiconductor device is viewed in a plan view) as shown in FIG. 12B. In such a case, it is sufficient that the relationship of $|Dc-Dd|\leq 0.5W$ is satisfied at the respective locations where crystal defects are formed. In FIG. 11A and FIG. 12A, for simplifying the description, it is described that the center depths Dc of regions Rc where a carrier pool is formed when a reverse recovery current exhibits a peak value are equal in all ranges shown in the drawings.

In the embodiment 6, Dc exhibits 1.1Dp at the location where Dc takes a minimum value. As a matter of course, Dc is a depth when a first main surface side of the semiconductor base substrate 110 is used as a reference. Accordingly, "location where Dc takes a minimum value" can be also referred to as "location where Dc becomes shallowest". The above-mentioned Dc is provided merely as an exemplifying purpose. As a result of studies made by the inventors of the present invention, it is found that, at a location where Dc becomes shallowest, a relationship of $1.05Dp\leq Dc\leq 1.15Dp$ is established in general, and a relationship of $1.05Dp\leq Dc\leq 1.1Dp$ is established in many cases.

In the embodiment 6, Dc−Dd is 0.5Dp as the location where Dc−Dd takes a minimum value, and 0.5W is 0.15Dp in the same manner as the embodiment 1.

The above-mentioned MOSFET 400 can be manufactured in accordance with a method basically equal to the method of manufacturing a semiconductor device according to the embodiment 1. That is, in the method of manufacturing a semiconductor device according to the embodiment 6 in crystal defect forming step, crystal defects are formed so as to satisfy a relationship of $0.25Dp\leq Dd<0.95Dp$ and a relationship of $0.05Dp<W<0.5Dp$ in the crystal defect forming step.

Further, in the method of manufacturing a semiconductor device of the embodiment 6, assuming a semiconductor device having substantially the same configuration as a semiconductor device (MOSFET 400) which is intended to be manufactured excluding that the crystal defects are not formed as the base semiconductor device $400a$ (see FIG. 12A), and assuming a center depth of a region Rc where a carrier pool is formed when a reverse recovery current exhibits a peak value in a case where a reverse recovery operation is applied to the base semiconductor device $400a$ from a state that a body diode of the base semiconductor device $400a$ is biased forward so that a forward current which is ½ or more of a rated current flows as Dc, in the crystal defect forming step, the crystal defects are formed such that a relationship of $|Dc-Dd|\geq 0.5W$ is satisfied.

In this manner, although the MOSFET 400 according to the embodiment 6 satisfies the relationship of $|Dc-Dd|\geq 0.5W$, the MOSFET 400 according to the embodiment 6 also satisfies a relationship of $0.25Dp\leq Dd<0.95Dp$ and a relationship of $0.05Dp<W<0.5Dp$. Accordingly, in the same manner as the MOSFET 100 according to the embodiment 1, it is possible to provide the semiconductor device (MOSFET) which can reduce a recovery loss and in which oscillation is not easily generated compared to conventional semiconductor devices (MOSFETs).

Further, according to the MOSFET 400 of the embodiment 6, the relationship of $|Dc-Dd|\geq 0.5W$ is satisfied. Accordingly, it is possible to sufficiently reduce crystal defects existing at the depth position corresponding to the center depth Dc of the region Rc where a carrier pool is formed when a reverse recovery current exhibits a peak value in the base semiconductor device $400a$. As a result, according to the MOSFET 400 of the embodiment 6, rapid recoupling of carrier existing in a carrier pool can be suppressed and hence, it is possible to prevent a reverse recovery current (Irr) from becoming further rapidly small (dIr/dt becoming large) after the reverse recovery current (Irr) passes a peak value (Irp) whereby it is possible to ensure a state where oscillation is minimally generated.

In the method of manufacturing a semiconductor device according to the embodiment 6, although crystal defects are formed such that a relationship of |Dc−Dd|≥0.5W is satisfied in the crystal defect forming step, crystal defects are also formed such that a relationship of 0.25Dp≤Dd<0.95Dp and a relationship of 0.05Dp<W<0.5Dp are satisfied in the crystal defect forming step. Accordingly, in the same manner as the method of manufacturing a semiconductor device according to the embodiment 1, it is possible to manufacture the semiconductor device (MOSFET 400) which can reduce a recovery loss and in which oscillation is not easily generated compared to the conventional semiconductor devices (MOSFETs).

Further, in the method of manufacturing a semiconductor device of the embodiment 6, crystal defects are formed such that a relationship of |Dc−Dd|≥0.5W is satisfied in crystal defect forming step. Accordingly, it is possible to sufficiently reduce crystal defects existing at the depth position corresponding to the center depth Dc of the region Rc where a carrier pool is formed when a reverse recovery current exhibits a peak value in the base semiconductor device 400a, and, as a result, rapid recoupling of carrier existing in a carrier pool can be suppressed and hence, it is possible to prevent a reverse recovery current (Irr) from becoming further rapidly small (dIr/dt becoming large) after the reverse recovery current (Irr) passes a peak value (Irp). Accordingly, it is possible to manufacture the semiconductor device where it is possible to ensure a state where oscillation is minimally generated.

Embodiment 7

In an embodiment 7, setting a depth of Dd which is a depth at which density of crystal defects exhibits a maximum value using a first main surface as a reference is described from a viewpoint which differs from viewpoints of the embodiment 1 and the embodiment 6.

Figure 13A:
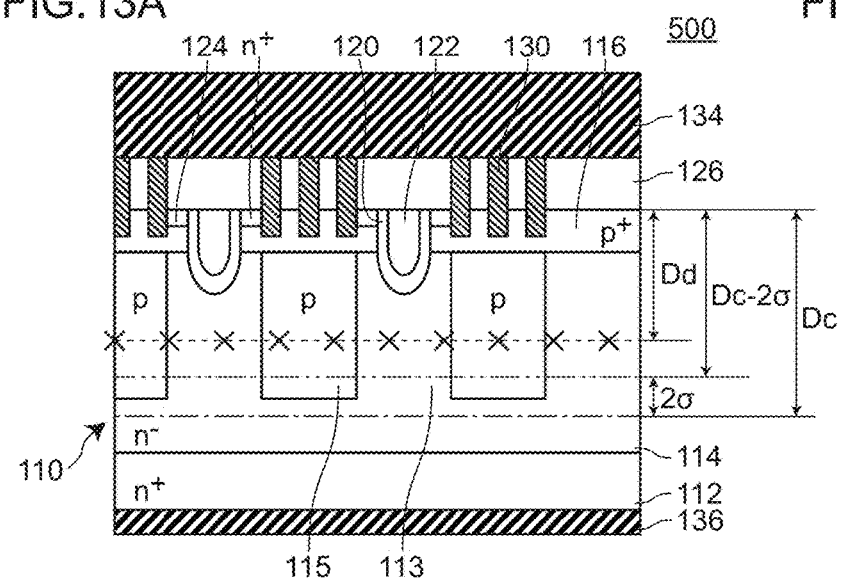
FIG. 13A and FIG. 13B are views for describing a MOSFET 500 according to an embodiment 7.
Figure 13B:
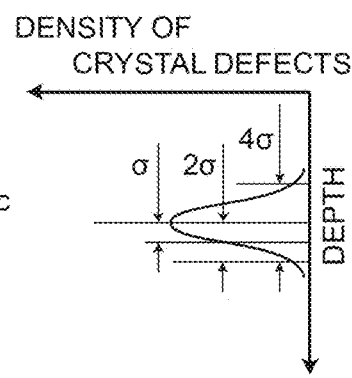

As shown in FIG. 13A and FIG. 13B, the configuration of a MOSFET 500 according to the embodiment 7 is substantially equal to the configuration of the MOSFET 100 according to the embodiment 1 and the configuration of the MOSFET 400 according to the embodiment 6. That is, the configuration of the MOSFET 100 and the configuration of the MOSFET 400 satisfy the conditions described with respect to the embodiment 7. The MOSFET 500 according to the embodiment 7 may have the configuration which differs from the configuration of the MOSFET 100 and the configuration of the MOSFET 400 provided that the conditions described hereinafter are satisfied.

As shown in FIG. 13A and FIG. 13B, in the MOSFET 500 according to the embodiment 7, the distribution of density of the crystal defects as viewed along the depth direction is a Gaussian distribution and a relationship of Dd≤Dc−2σ is satisfied. The definition of Dc is substantially equal to the definition of Dc used in the embodiment 6. Gaussian distribution is also referred to as normal distribution. "σ" is standard deviation of distribution of density of crystal defects.

Dc in the embodiment 7 is 1.1Dp in the location where Dc takes a minimum value in the same manner as the embodiment 6. When the distribution of density of crystal defects is the Gaussian distribution, a relationship between W and σ is expressed as W≈2.354σ. Also in the embodiment 7, in the same manner as the embodiment 6, a relationship of 0.5W=0.15Dp is established and hence, a relationship of σ≈0.1274Dp is established. That is, in the embodiment 7, Dc−2σ is approximately 0.8452Dp. Dd in the embodiment 7 is 0.6Dp which is equal to Dd in the embodiment 1.

When the distribution of density of crystal defects is the Gaussian distribution, approximately 95.4% of crystal defects exist within a depth range of 4σ with respect to Dd such that 2σ is on both sides of Dd respectively. When the relationship of Dd≤Dc−2σ is satisfied, a distance between Dd and Dc becomes 2σ or more. Accordingly, when the relationship of Dd≤Dc−2σ is satisfied, it is possible to prevent the center of the region Rc and a range where crystal defects exist do not overlap with each other.

The above-mentioned MOSFET 500 can be manufactured by a method basically substantially equal to the method of manufacturing a semiconductor device according to the embodiment 1. However, in crystal defect forming step of the method of manufacturing a semiconductor device according to the embodiment 7, the distribution of density of the crystal defects as viewed along the depth direction becomes a Gaussian distribution, and crystal defects are formed such that the relationship of Dd≤Dc−2σ is satisfied. Density of crystal defects formed by He irradiation or proton irradiation indicates a Gaussian distribution in general.

According to the MOSFET 500 of the embodiment 7, the relationship of 0.25Dp≤Dd<0.95Dp and the relationship of 0.05Dp<W<0.5Dp are satisfied. Accordingly, in the same manner as the MOSFET 100 according to the embodiment 1, it is possible to provide the semiconductor device (MOSFET) which can reduce a recovery loss and in which oscillation is not easily generated compared to conventional semiconductor devices (MOSFETs).

Further, according to the MOSFET 500 of the embodiment 7, the distribution of density of the crystal defects as viewed along the depth direction becomes a Gaussian distribution, and a relationship of Dd≤Dc−2σ is satisfied. Accordingly, by setting a distance between Dc and Dd to 2σ or more, it is possible to sufficiently reduce crystal defects existing at a depth position corresponding to Dc. As a result, according to the MOSFET 500 of the embodiment 7, it is possible to suppress rapid recoupling of carriers existing in a carrier pool and hence, it is possible to prevent the occurrence of phenomenon where a reverse recovery current (Irr) becomes further rapidly small (dIr/dt becoming large) after the reverse recovery current (Irr) passes a peak value (Irp) whereby it is possible to ensure a state where oscillation is not easily generated.

According to the method of manufacturing a semiconductor device of the embodiment 7, in crystal defect forming step, crystal defects are formed so as to satisfy the relationship of 0.25Dp≤Dd<0.95Dp and the relationship of 0.05Dp<W<0.5Dp. Accordingly, in the same manner as the method of manufacturing a semiconductor device according to the embodiment 1, it is possible to manufacture the semiconductor device (MOSFET 500) which can reduce a recovery loss and in which oscillation is not easily generated compared to conventional semiconductor devices (MOSFETs).

Further, according to the method of manufacturing a semiconductor device of the embodiment 7, in crystal defect forming step, the distribution of density of the crystal defects as viewed along the depth direction is a Gaussian distribution, and crystal defects are formed such that a relationship of Dd≤Dc−2σ is satisfied. By setting a distance between Dc and Dd to 2σ or more, it is possible to sufficiently reduce crystal defects existing at the depth position corresponding to Dc. As a result, according to the method of manufacturing a semiconductor device of the embodiment 7, the semiconductor device (MOSFET 500) according to the embodiment 7 can be manufactured.

Embodiment 8

In the embodiment 8, setting of a depth of Dd which is a depth at which density of crystal defects exhibits a maximum value using a first main surface as a reference is described from a viewpoint different from, the viewpoint adopted by the embodiment 1.

Figure 14A:
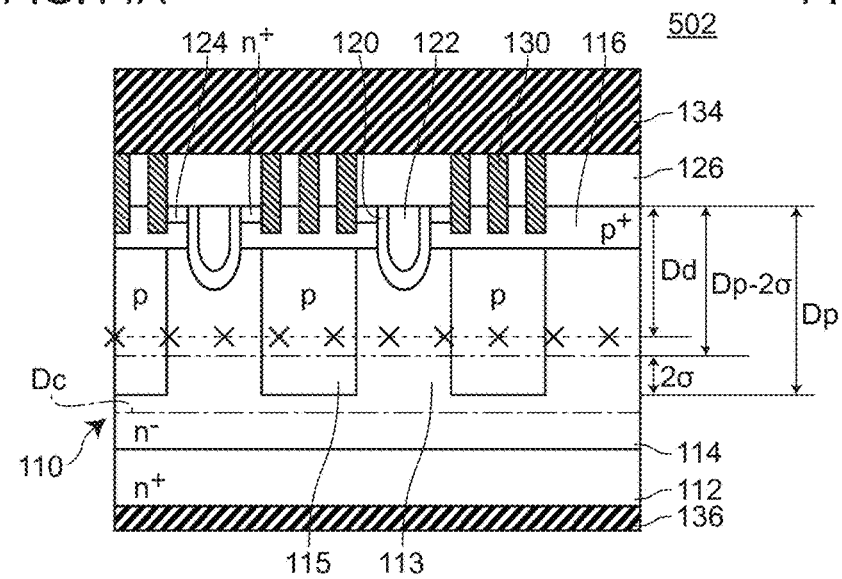
FIG. 14A and FIG. 14B are views for describing a MOSFET 502 according to an embodiment 8.
Figure 14B:
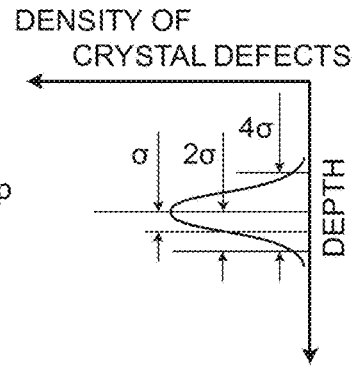

As shown in FIG. 14A and FIG. 14B, the configuration of the MOSFET 502 according to the embodiment 8 is substantially equal to the MOSFET 500 according to the embodiment 1. The configuration of the MOSFET 502 is described for the convenience sake for simplifying the description. That is, the configuration of the MOSFET 500 also satisfies conditions described in the embodiment 8. The MOSFET 502 according to the embodiment 6 may have the configuration which differs from the MOSFET 500 provided that the conditions described hereafter are satisfied.

As shown in FIG. 14A and FIG. 14B, in the MOSFET 502 according to the embodiment 8, the distribution of density of crystal defects as viewed along the depth direction is a Gaussian distribution, and a relationship of Dd≤Dp−2σ is satisfied.

Also in the embodiment 8, a relationship of σ≈0.1274Dp is adopted in the same manner as the embodiment 7 and hence, Dp−2σ in the embodiment 8 is approximately 0.7452Dp.

In the semiconductor device such as the MOSFET 502 according to the embodiment 8, Dc is positioned at a deeper location than Dp basically (see FIG. 14A). Accordingly, a relationship of Dd≤Dp−2σ is adopted as in the case of the embodiment 8, an upper limit of a value of Dd which can be set in general becomes small compared to the case where a relationship of Dd≤Dc−2σ is adopted. It is safe to say that the MOSFET 502 according to the embodiment 8 adopts the structure where a large margin is made with respect to a distance between Dd and Dc compared with the MOSFET 500 according to the embodiment 7. "an upper limit of a value of Dd becomes small" may be also referred to as "a limit of a depth which can set Dd becomes shallow".

The above-mentioned MOSFET 502 can be manufactured by a method basically substantially equal to the method of manufacturing a semiconductor device according to the embodiment 1. However, in crystal defect forming step of the method of manufacturing a semiconductor device according to the embodiment 8, the distribution of density of the crystal defects as viewed along the depth direction is a Gaussian distribution, and crystal defects are formed such that a relationship of Dd≤Dp−2σ is satisfied.

According to the MOSFET 502 of the embodiment 8, the relationship of 0.25Dp≤Dd<0.95Dp and the relationship of 0.05Dp<W<0.5Dp are satisfied. Accordingly, in the same manner as the MOSFET 100 according to the embodiment 1, it is possible to provide the semiconductor device (MOSFET) which can reduce a recovery loss and in which oscillation is not easily generated compared to conventional semiconductor devices (MOSFETs).

In the MOSFET 502 according to the embodiment 8, the distribution of density of the crystal defects as viewed along the depth direction is a Gaussian distribution and a relationship of Dd≤Dp−2σ is satisfied. Accordingly, by setting a distance between Dp and Dd to 2σ or more such that crystal defects existing at the depth position corresponding to Dp can be sufficiently reduced. As a result, an amount of crystal defects existing at the depth position corresponding to Dc can be further reduced. In this manner, according to the MOSFET 502 of the embodiment 8, rapid recoupling of carriers existing in a carrier pool can be suppressed and hence, a reverse recovery current (Irr) becomes further rapidly small (dIr/dt becoming large) after the reverse recovery current (Irr) passes a peak value (Irp) whereby it is possible to ensure a state where oscillation is minimally generated. In the case where Dd≤Dp−2σ is adopted, in general, a lower limit of Dd becomes shallow compared to the case where Dd≤Dc−2σ is adopted. Accordingly, the MOSFET 502 according to the embodiment 8 can ensure a state where oscillation is minimally generated with more tolerance than the MOSFET 500 according to the embodiment 7.

According to the method of manufacturing a semiconductor device of the embodiment 8, in the crystal defect forming step, crystal defects are formed so as to satisfy the relationship of 0.25Dp≤Dd<0.95Dp and the relationship of 0.05Dp<W<0.5Dp. Accordingly, in the same manner as the method of manufacturing a semiconductor device according to the embodiment 1, it is possible to manufacture the semiconductor device (MOSFET 502) which can reduce a recovery loss and in which oscillation is not easily generated compared to conventional semiconductor devices (MOSFETs).

According to the method of manufacturing a semiconductor device of the embodiment 8, in the crystal defect forming step, the distribution of density of the crystal defects as viewed along the depth direction is a Gaussian distribution, and crystal defects are formed such that the relationship of Dd≤Dp−2σ is satisfied. Accordingly, by setting the distance between Dp and Dd to 2σ or more, an amount of crystal defects existing at the depth position corresponding to Dc can be reduced. As a result, according to the method of manufacturing a semiconductor device of the embodiment 8, the semiconductor device (MOSFET 502) according to the embodiment 8 can be manufactured.

The present invention has been described heretofore based on the above-mentioned embodiments. However, the present invention is not limited to the above-mentioned embodiments. The present invention can be carried out in various modes without departing from the gist of the present invention. For example, the following modifications are conceivable.

(1) The numbers, the positions and the like of the constitutional elements described in the above-mentioned respective embodiments are provided for an exemplifying purpose, and the numbers, the positions and the like of the constitutional elements can be changed within a range that advantageous effects of the present invention are not impaired.

Figure 15:
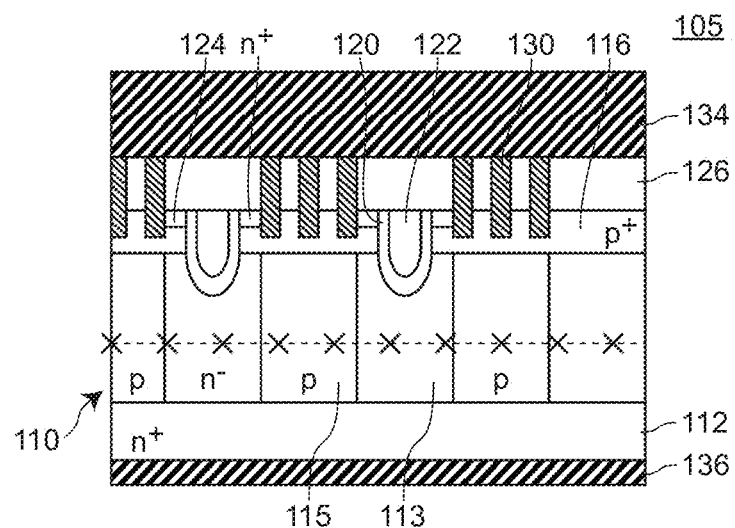
FIG. 15 is a cross-sectional view showing the configuration of a portion of a MOSFET 105 according to a modification 1.

(2) In the above-mentioned respective embodiments, the buffer layer 114 of an n-type exists between the low-resistance semiconductor layer 112 on one side and the n-type column regions 113 and the p-type column regions 115 (super junction structure) on the other side. However, the present invention is not limited to such a configuration. As shown in FIG. 15, the low-resistance semiconductor layer 112 on one side and the n-type column regions 113 and the p-type column regions 115 on the other side may be directly brought into contact with each other.

(3) In the above-mentioned embodiment 1, He irradiation or proton irradiation is performed from a side opposite to the first main surface in the crystal defect forming step S2. However, the present invention is not limited to such a case. In crystal defect forming step, He irradiation or proton irradiation may be performed from a first main surface side. However, in this case, there is a possibility that qualities of the gate insulation film, the interlayer insulation film, and a passivation film on the first main surface side are affected by irradiation and hence, it is preferable to perform He irradiation or proton irradiation from the side opposite so the first main surface as in the case of the above-mentioned embodiment 1.

(4) In the above-mentioned embodiment 1, back grinding step S4 and drain electrode forming step S5 are performed after crystal defect forming step S2. However, the present invention is not limited to such a procedure. Back grinding step S4 and drain electrode forming step S5 may be performed before crystal defect forming step S2. However, there is a possibility that the structure on a drain electrode side is affected by irradiation and hence, it is preferable to perform back grinding step and drain electrode forming step after crystal defect forming step as in the case of the above-mentioned embodiment 1.

Figure 16:
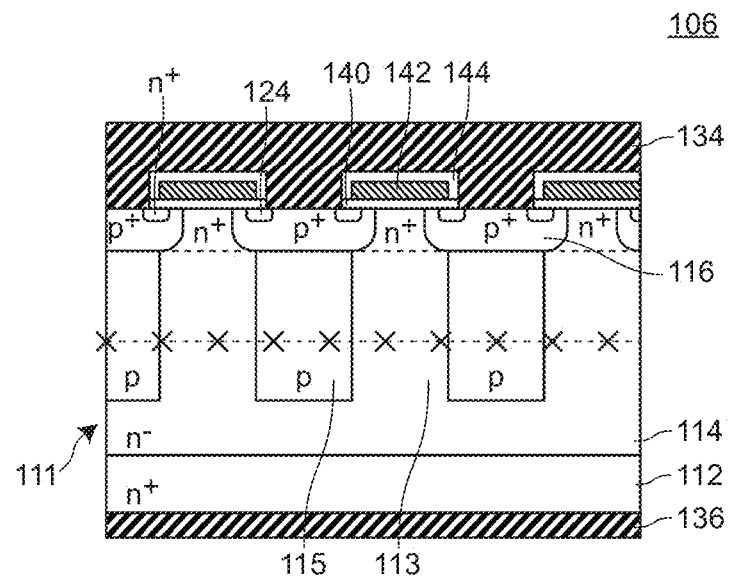
FIG. 16 is a cross-sectional view showing the configuration of a portion of a MOSFET 106 according to a modification 2.
Figure 17:
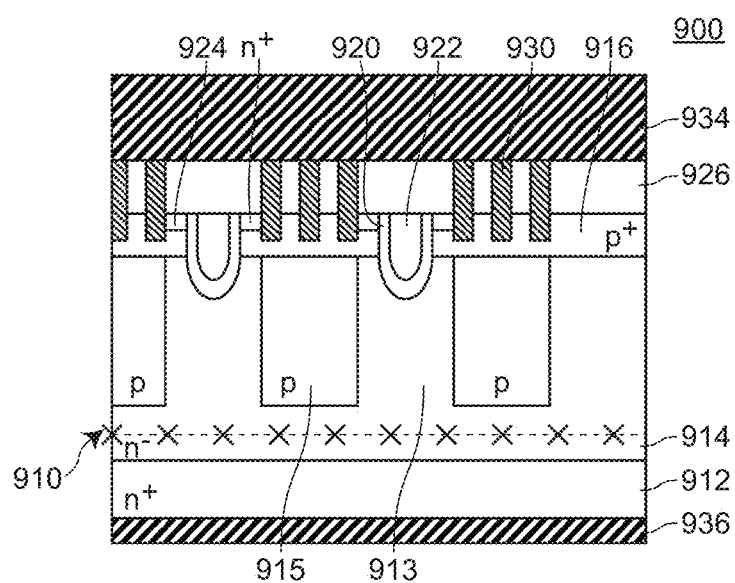
FIG. 17 is a cross-sectional view showing the configuration of a portion of a conventional MOSFET 900.

(5) In the above-mentioned respective embodiments, the present invention has been described using the so-called trench-gate-type MOSFET. However, the present invention is not limited to such a MOSFET. For example, as shown in FIG. 16, the present invention is also applicable to a so-called planar-gate-type MOSFET. A MOSFET 106 according to a modification 2 shown in FIG. 16 includes a semiconductor base substrate 111, gate insulation films 140, gate electrodes 142, and interlayer insulation films 144 which correspond to the planar-gate-type MOSFET.

(6) In the above-mentioned respective embodiments, the present invention has been described using the MOSFET which includes the metal plugs 130. However, the present invention is not limited to such a configuration. The present invention is also applicable to a MOSFET which does not include the metal plugs.

(7) The present invention also includes embodiments where the arrangement of n-type and p-type is opposite compared to the above-mentioned respective embodiments.

(8) A MOSFET is used as the semiconductor device in the above-mentioned respective embodiments. However, the present invention is not limited to such a configuration. The present invention is applicable to other semiconductor devices such as a diode, an IGBT, a thyristor, and a triac provided that the semiconductor device uses a super junction structure.

(9) The above-mentioned method of manufacturing a semiconductor device according to the embodiment 1 includes preparation step S1, crystal defect forming step S2, annealing step S3, back grinding step S4, drain electrode forming step S5 in this order. However, the present invention is not limited to such a configuration. It is sufficient that the method of manufacturing a semiconductor device according to the present invention includes at least preparation step and crystal defect forming step.

The method of manufacturing a semiconductor device according to the embodiment 1 is carried out by performing the above-mentioned steps in the above-mentioned order. The above-mentioned steps are steps which are directly relevant to the present invention. In the actual manufacture of the semiconductor device (MOSFET 100), a large number of other steps are necessary. Also the embodiment 1 may include other steps before and after each step, particularly between preparation step S1 and crystal defect forming step S2. The same goes for the methods of manufacturing a semiconductor device briefly explained with respect to the embodiments 2 to 6.

What is claimed is:

1. A semiconductor device comprising:
    a semiconductor base substrate having an n-type column region and a p-type column region, the n-type column region and the p-type column region forming a super junction structure; and
    a gate electrode formed on a first main surface side of the semiconductor base substrate by way of a gate insulation film, wherein
    crystal defects whose density is increased locally as viewed along a depth direction are formed in the n-type column region and the p-type column region, and
    using the first main surface as a reference and assuming a depth to a deepest portion of the super junction structure as Dp, a depth at which density of the crystal defects exhibits a maximum value as Dd, and a half value width of density distribution of the crystal defects as W, a relationship of 0.25Dp≤Dd<0.95Dp and a relationship of 0.05Dp<W<0.5Dp are satisfied.

2. The semiconductor device according to claim 1, wherein a relationship of 0.4Dp≤Dd<0.9Dp is satisfied.

3. The semiconductor device according to claim 1, wherein a relationship of (Dp−Dd)>0.5W is satisfied.

4. A method of manufacturing a semiconductor device comprising in a following order:
    a preparation step where a predetermined structural body is prepared, the predetermined structural body including: a semiconductor base substrate having an n-type column region and a p-type column region, the n-type column region and the p-type column region forming a super junction structure; and a gate electrode formed on a first main surface side of the semiconductor base substrate by way of a gate insulation film; and
    a crystal defect forming step where crystal defects are formed in the n-type column region and the p-type column region of the predetermined structural body such that density of the crystal defects is increased locally as viewed along a depth direction, wherein
    in the crystal defect forming step, the crystal defects are formed such that, using the first main surface as a reference and assuming a depth to a deepest portion of the super junction structure as Dp, a depth at which density of the crystal defects exhibits a maximum value as Dd, and a half value width of density distribution of the crystal defects as W, a relationship of 0.25Dp≤Dd<0.95Dp and a relationship of 0.05Dp<W<0.5Dp are satisfied.

5. The method of manufacturing a semiconductor device according to claim 4, wherein in the crystal defect forming step, the crystal defects are formed such that a relationship of 0.4Dp≤Dd<0.9Dp is satisfied.

6. The method of manufacturing a semiconductor device according to claim 4, wherein in the crystal defect forming step, the crystal defects are formed such that a relationship of (Dp−Dd)>0.5W is satisfied.

7. The method of manufacturing a semiconductor device according to claim 4, wherein in the crystal defect forming step, the crystal defects are formed by He irradiation or by proton irradiation.

8. The method of manufacturing a semiconductor device according to claim 7, wherein a dose amount of the He irradiation or the proton Irradiation falls within a range of $5 \times 10^{10}/cm^2$ to $2 \times 10^{12}/cm^2$.

9. The method of manufacturing a semiconductor device according to claim 4 further comprises an annealing step where annealing is performed at a temperature of 300° C. to 500° C. after the crystal defect forming step.

10. The semiconductor device according to claim 1, wherein assuming a semiconductor device having substantially a same configuration as the semiconductor device excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, a relationship of |Dc−Dd|≥0.5W is satisfied.

11. The method of manufacturing a semiconductor device according to claim 4, wherein assuming a semiconductor device having substantially a same configuration as a semiconductor device which is intended to be manufactured excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, in the crystal defect forming step, the crystal defects are formed such that a relationship of |Dc−Dd|≥0.5W is satisfied.

12. The semiconductor device according to claim 1, wherein assuming a semiconductor device having substantially a same configuration as the semiconductor device excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, a distribution of density of the crystal defects as viewed along a depth direction is a Gaussian distribution, and a relationship of Dd≤Dc−2σ is satisfied.

13. The semiconductor device according to claim 1, wherein the distribution of density of the crystal defects as viewed along a depth direction is a Gaussian distribution, and a relationship of Dd≤Dp−2σ is satisfied.

14. The semiconductor device according to claim 1, wherein a relationship of Dd≤0.5Dp is satisfied.

15. The method of manufacturing a semiconductor device according to claim 4, wherein assuming a semiconductor device having substantially a same configuration as the semiconductor device excluding that the crystal defects are not formed as a base semiconductor device, and assuming a center depth of a region where a carrier pool is formed when a reverse recovery current exhibits a peak value in a case where a reverse recovery operation is applied to the base semiconductor device from a state that a body diode of the base semiconductor device is biased forward so that a forward current which is ½ or more of a rated current flows as Dc, in the crystal defect forming step, the crystal defects are formed such that the distribution of density of the crystal defects as viewed along the depth direction is a Gaussian distribution, and a relationship of Dd≤Dc−2σ is satisfied.

16. The method of manufacturing a semiconductor device according to claim 4, wherein in the crystal defect forming step, the crystal defects are formed such that the distribution of density of the crystal defects as viewed along the depth direction is a Gaussian distribution, and a relationship of Dd≤Dp−2σ is satisfied.

17. The method of manufacturing a semiconductor device according to claim 4, wherein in the crystal defect forming step, the crystal defects are formed such that a relationship of Dd≤0.5Dp is satisfied.

* * * * *